(12) United States Patent
Ozawa et al.

(10) Patent No.: US 10,020,240 B2
(45) Date of Patent: Jul. 10, 2018

(54) SEMICONDUCTOR DEVICE

(71) Applicant: SHINKO ELECTRIC INDUSTRIES CO., LTD., Nagano-shi, Nagano-ken (JP)

(72) Inventors: Takashi Ozawa, Nagano (JP); Yasuhiro Sakuda, Nagano (JP)

(73) Assignee: SHINKO ELECTRIC INDUSTRIES CO., LTD. (JP)

( * ) Notice: Subject to any disclaimer, the term of this patent is extended or adjusted under 35 U.S.C. 154(b) by 0 days.

(21) Appl. No.: 15/461,791

(22) Filed: Mar. 17, 2017

(65) Prior Publication Data
US 2017/0287805 A1 Oct. 5, 2017

(30) Foreign Application Priority Data

Mar. 30, 2016 (JP) .................. 2016-068625

(51) Int. Cl.
*H01L 23/367* (2006.01)
*H01L 23/00* (2006.01)
*H01L 23/31* (2006.01)

(52) U.S. Cl.
CPC ........ *H01L 23/367* (2013.01); *H01L 23/3114* (2013.01); *H01L 23/3185* (2013.01); *H01L 24/16* (2013.01); *H01L 2224/16227* (2013.01)

(58) Field of Classification Search
CPC ............... H01L 23/367; H01L 23/3114; H01L 23/3185; H01L 24/16; H01L 2224/16227
USPC ........................................ 257/717, 707, 713
See application file for complete search history.

(56) References Cited

U.S. PATENT DOCUMENTS

| | | | | |
|---|---|---|---|---|
| 2002/0084523 | A1* | 7/2002 | Sorimachi | ........... H01L 23/4334 257/713 |
| 2004/0190259 | A1* | 9/2004 | Labanok | ................ H01L 23/36 361/704 |
| 2004/0232534 | A1* | 11/2004 | Seki | ......................... C25D 5/02 257/678 |
| 2006/0027900 | A1* | 2/2006 | Takeuchi | ............ H01L 23/4334 257/675 |
| 2017/0047264 | A1* | 2/2017 | Im | ......................... H01L 23/367 |

FOREIGN PATENT DOCUMENTS

JP 2009-302556 A 12/2009

* cited by examiner

*Primary Examiner* — Cuong Q Nguyen
*Assistant Examiner* — Tong-Ho Kim
(74) *Attorney, Agent, or Firm* — Tarolli, Sundheim, Covell & Tummino LLP

(57) ABSTRACT

A semiconductor device includes a wiring substrate, a semiconductor element mounted on the wiring substrate, a heat dissipation plate bonded to an upper surface of the semiconductor element with an adhesive, and an encapsulation resin that fills a gap between the heat dissipation plate and the wiring substrate. The heat dissipation plate includes a body overlapped with the semiconductor element in a plan view. The body is larger than the semiconductor element in a plan view. A projection is formed integrally with the body. The projection projects outward from an end of the body and is located at a lower position than the body. The encapsulation resin covers upper, lower, and side surfaces of the projection. The body includes an upper surface exposed from the encapsulation resin.

15 Claims, 16 Drawing Sheets

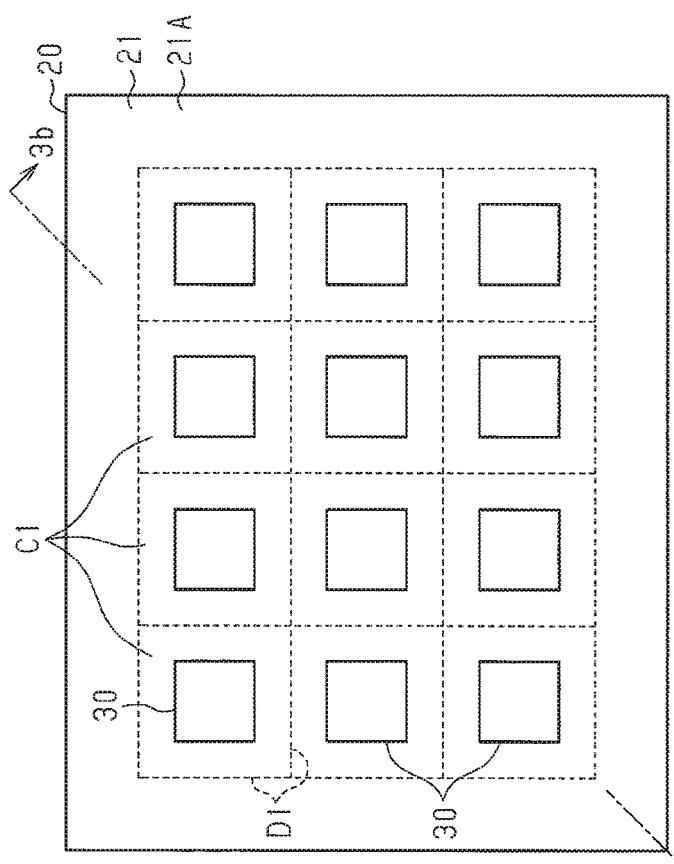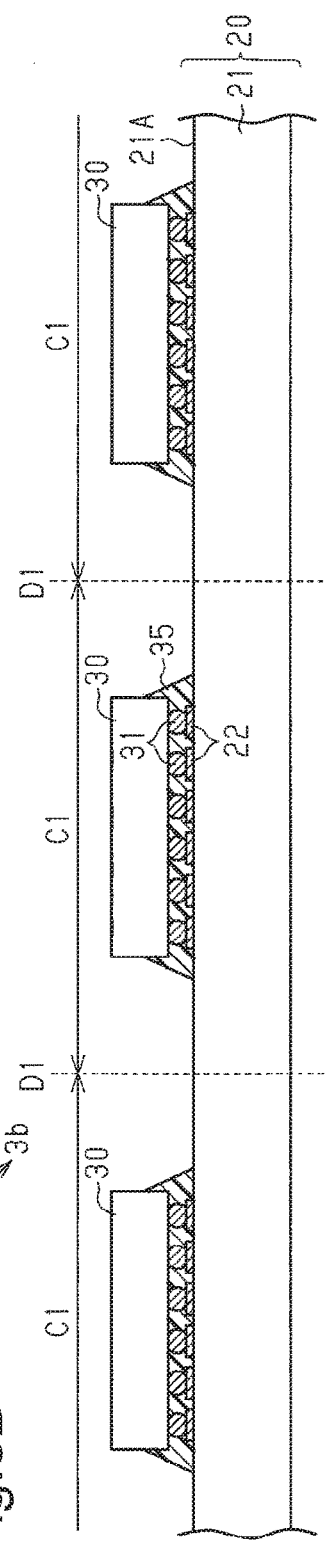
Fig.3A
Fig.3B

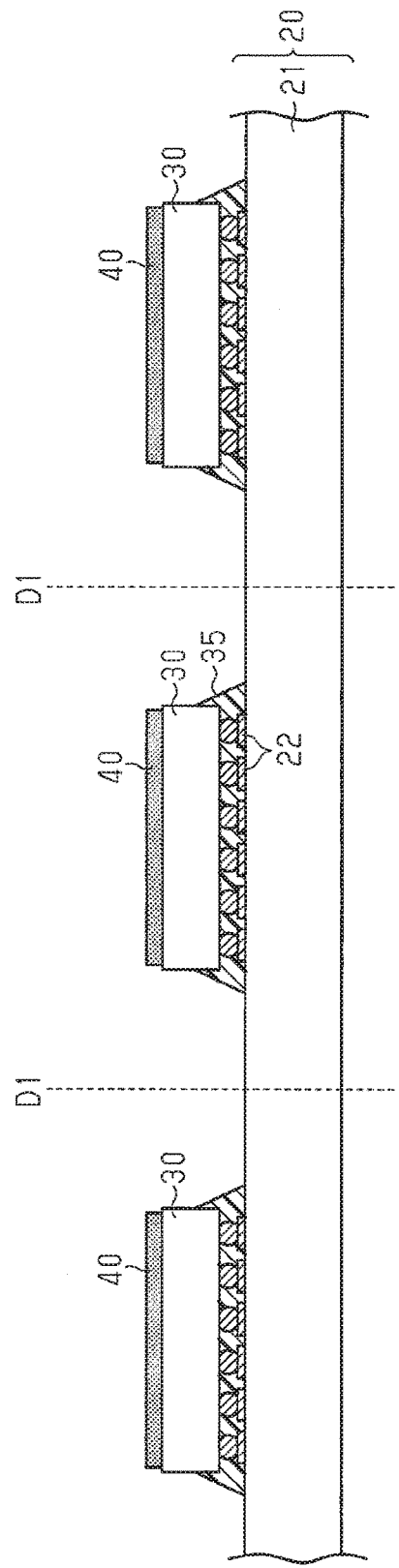

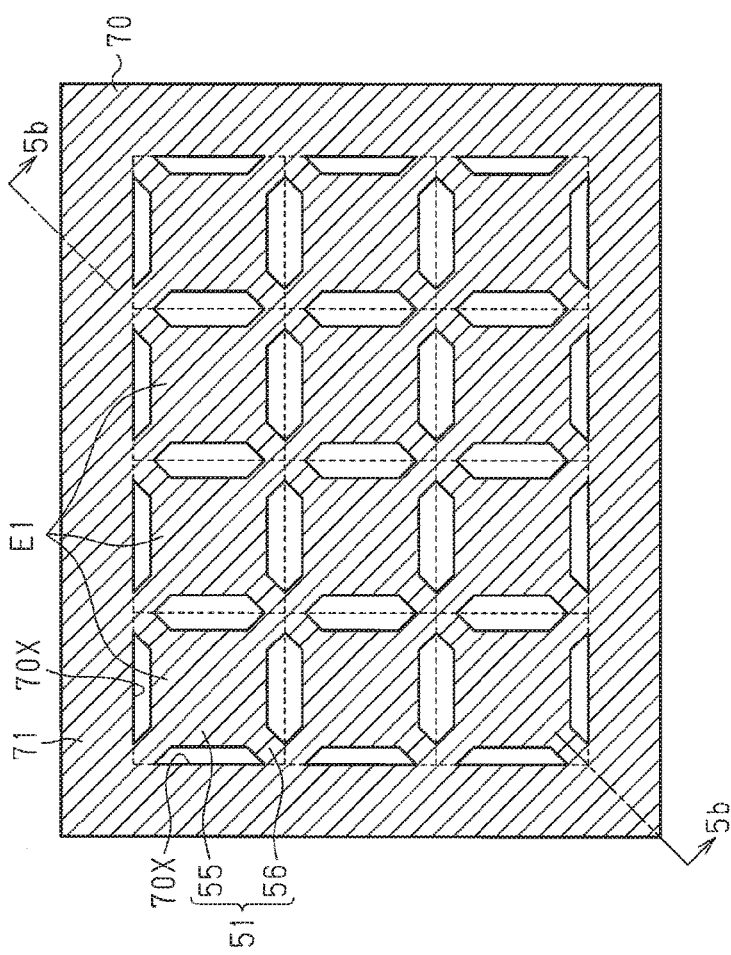
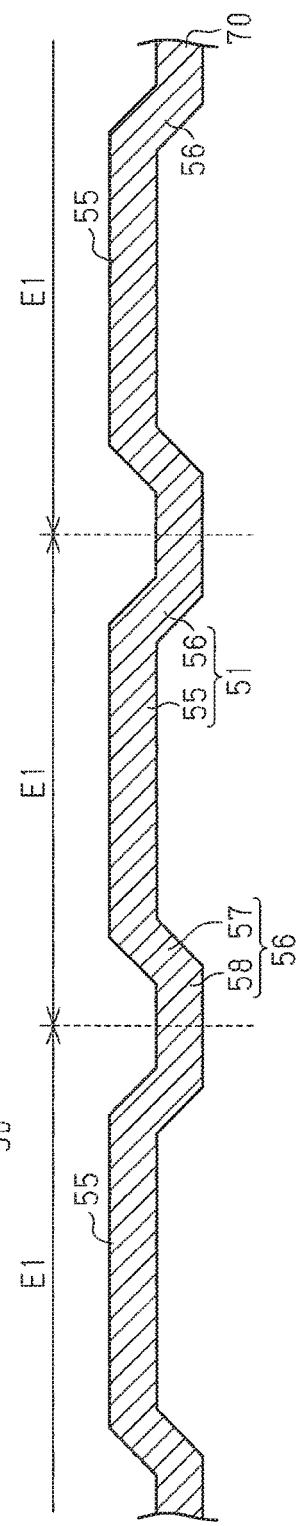
Fig.5A
Fig.5B

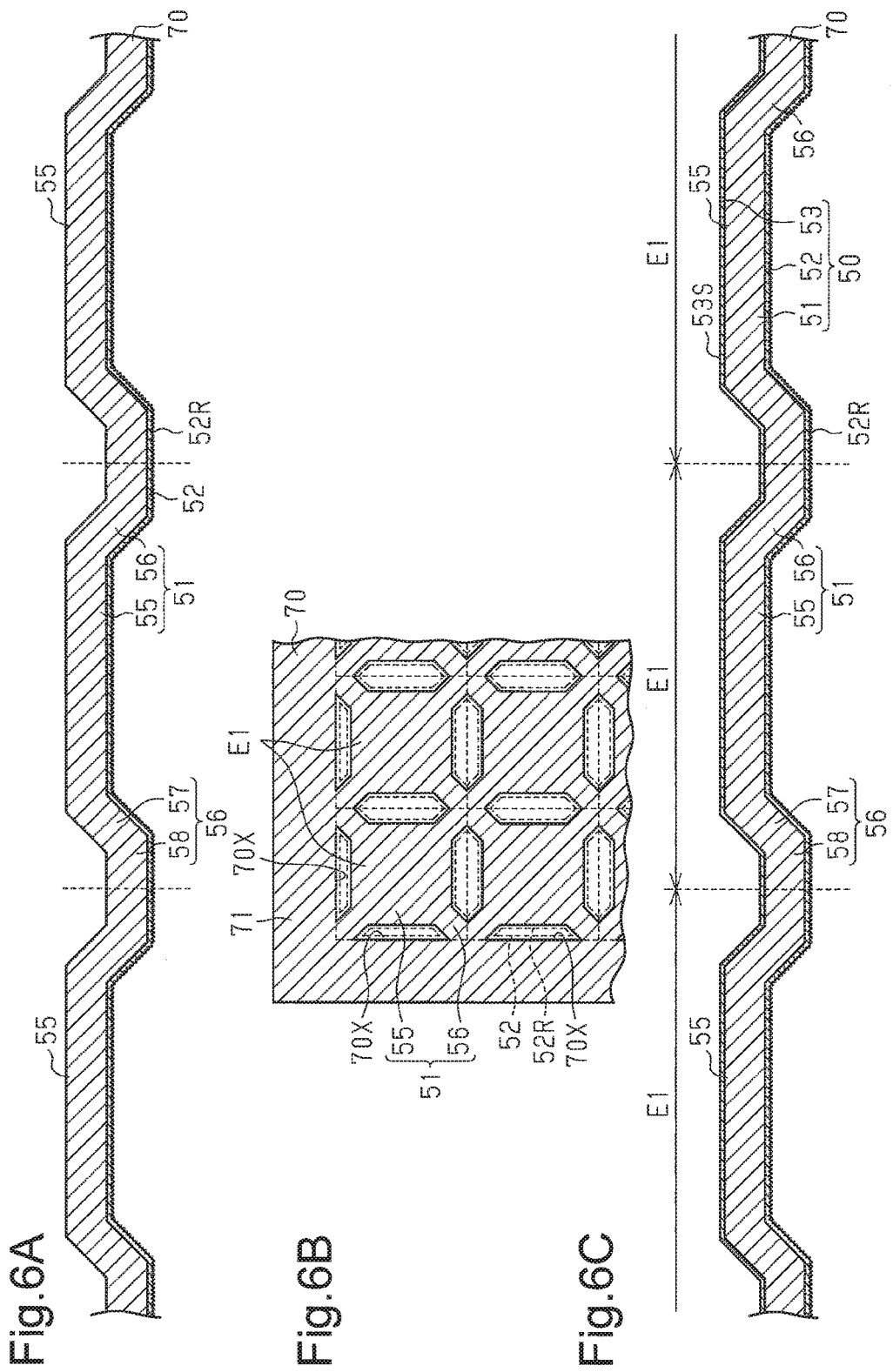

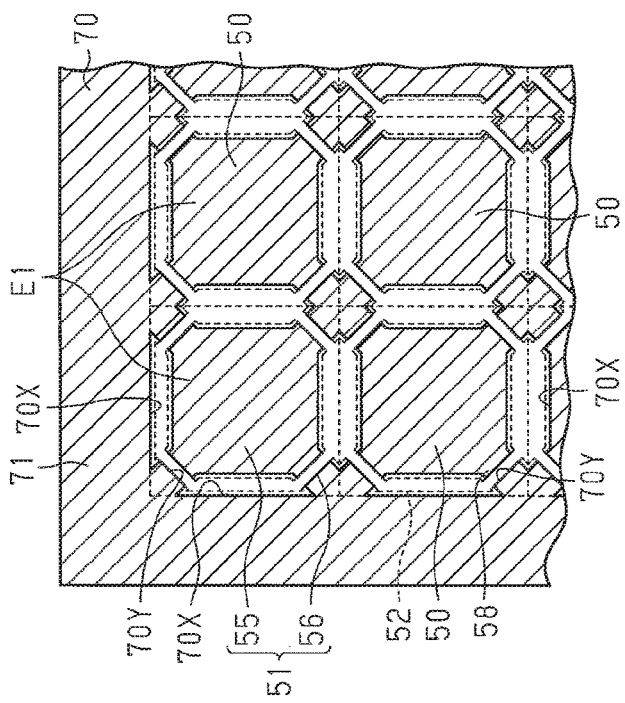
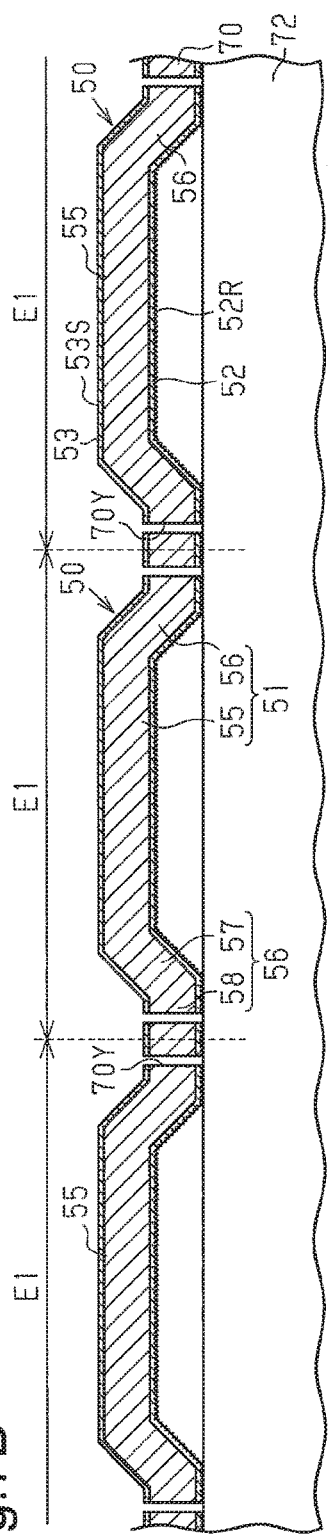
Fig.7A
Fig.7B

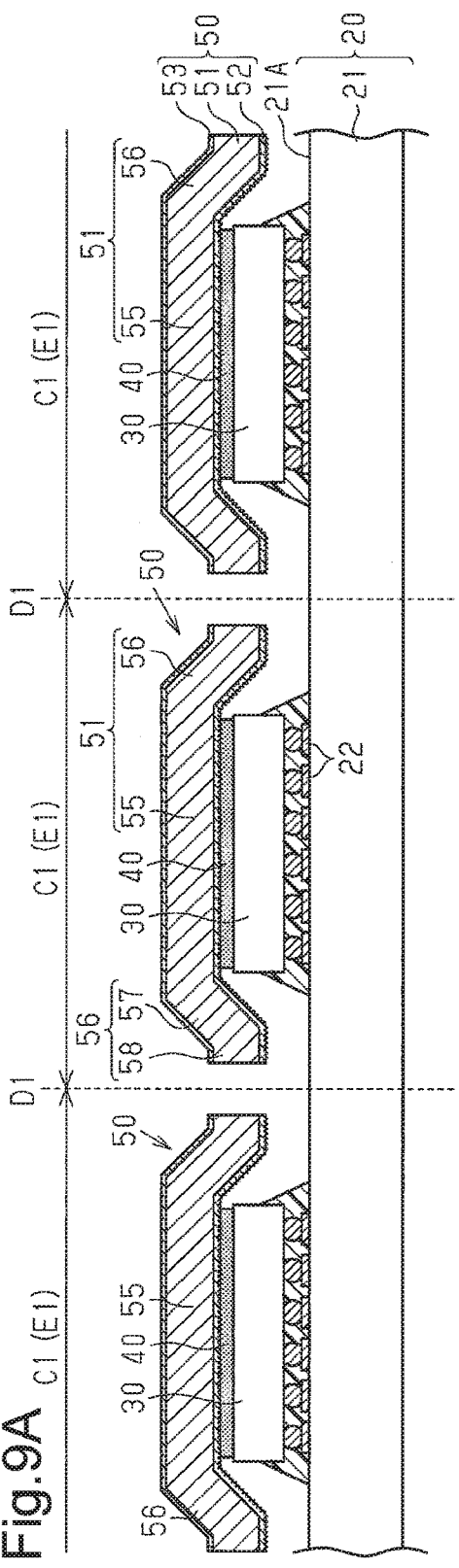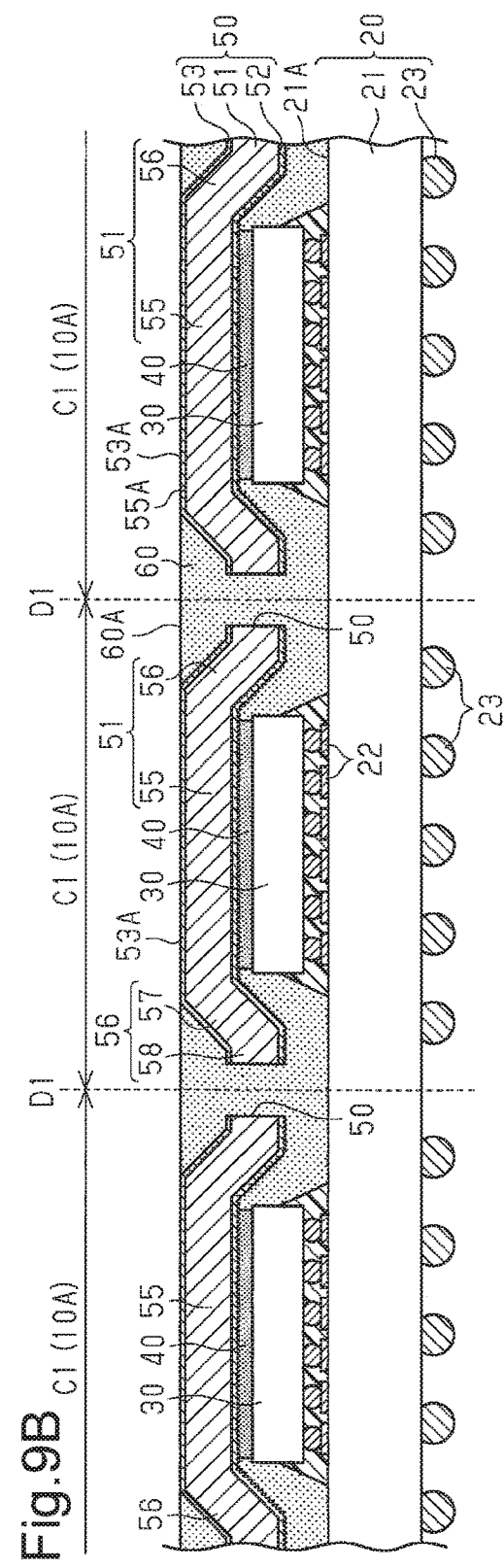

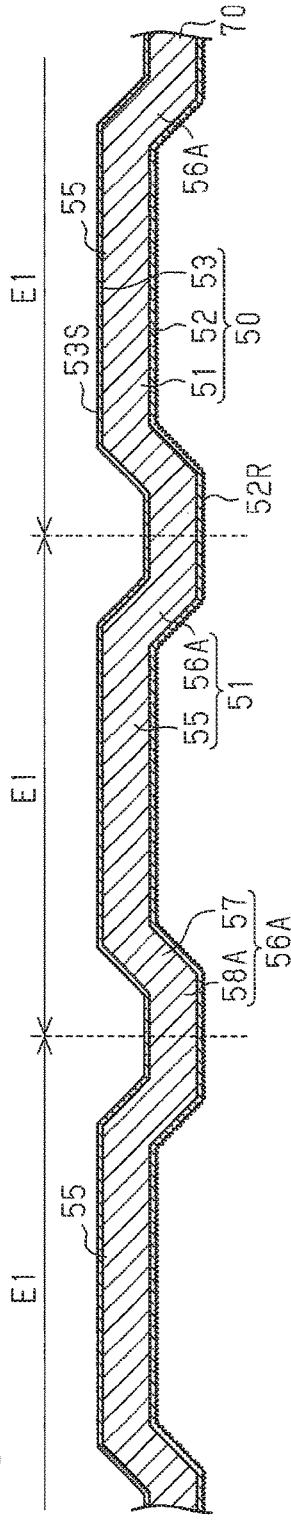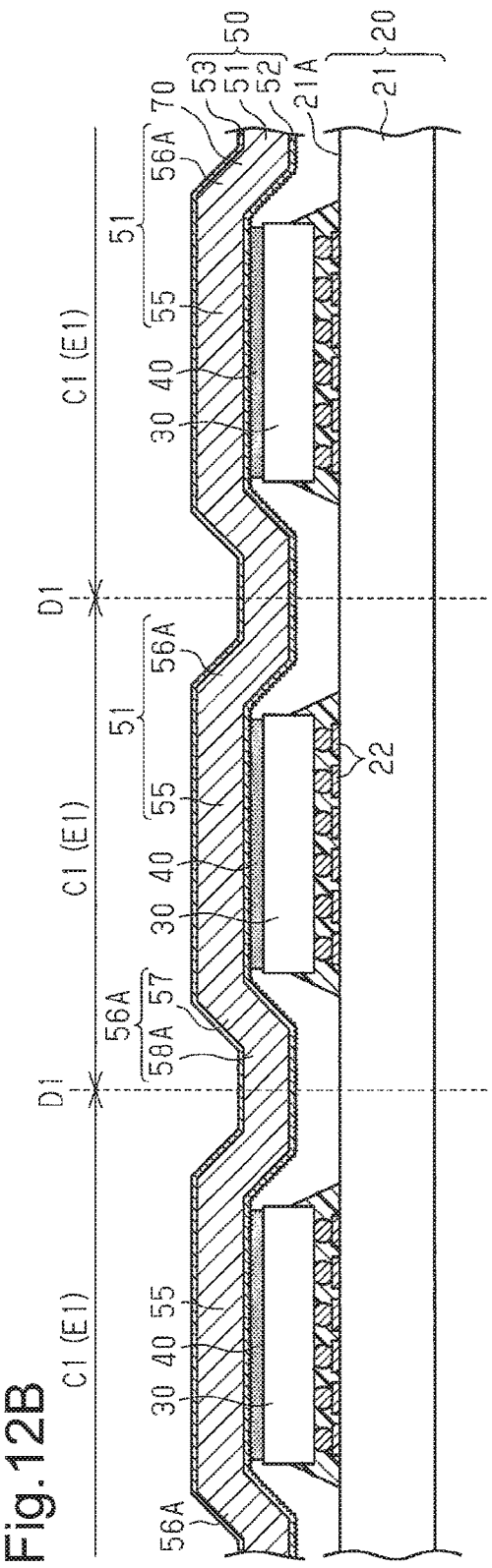

SEMICONDUCTOR DEVICE

CROSS-REFERENCE TO RELATED APPLICATIONS

This application is based upon and claims the benefit of priority from prior Japanese Patent Application No. 2016-068625, filed on Mar. 30, 2016, the entire contents of which are incorporated herein by reference.

FIELD

This disclosure relates to a semiconductor device and a method for manufacturing a semiconductor device.

BACKGROUND

The performance and speed of semiconductor elements used in central processing units (CPUs) and the like have increased. This has increased the amount of heat generated by the semiconductor elements. An increase in the temperature of a semiconductor element may reduce the operation speed of the semiconductor element or cause a failure in the semiconductor element.

To reduce such increases in the temperature of semiconductor elements, various techniques for dissipating heat or cooling semiconductor devices have been proposed. Japanese Laid-Open Patent Publication No. 2009-302556 describes a semiconductor device that includes a heat dissipation plate formed from a metal having a high thermal conductivity. The heat dissipation plate is thermally coupled to a semiconductor element mounted on a wiring substrate by an adhesive. In this structure, when the semiconductor element generates heat, the heat is transmitted to the heat dissipation plate through the adhesive and then to the atmospheric air from the heat dissipation plate. This efficiently dissipates the heat from the semiconductor element and limits increases in the temperature of the semiconductor element.

SUMMARY

In a conventional semiconductor device, a wiring substrate and a heat dissipation plate need to be thick enough to ensure the mechanical strength of the semiconductor device. This inhibits a decrease in the thickness of the entire semiconductor device.

One embodiment is a semiconductor device including a wiring substrate. A semiconductor element is mounted on the wiring substrate. A heat dissipation plate is bonded to an upper surface of the semiconductor element with an adhesive. An encapsulation resin fills a gap between the heat dissipation plate and the wiring substrate. The heat dissipation plate includes a body overlapped with the semiconductor element in a plan view. The body is larger than the semiconductor element in a plan view. A projection is formed integrally with the body. The projection projects outward from an end of the body and is located at a lower position than the body. The encapsulation resin covers upper, lower, and side surfaces of the projection. The body includes an upper surface exposed from the encapsulation resin.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 3A is a schematic plan view illustrating a method for manufacturing the semiconductor device of FIG. 1;

FIG. 3B is a schematic cross-sectional view illustrating the method for manufacturing the semiconductor device of FIG. 1 (cross-sectional view taken along line 3b-3b in FIG. 3A);

FIG. 4 is a schematic cross-sectional view illustrating the method for manufacturing the semiconductor device of FIG. 1;

FIG. 5A is a schematic plan view illustrating the method for manufacturing the semiconductor device of FIG. 1;

FIG. 5B is a schematic cross-sectional view illustrating the method for manufacturing the semiconductor device of FIG. 1 (cross-sectional view taken along line 5b-5b in FIG. 5A);

FIGS. 6A and 6C are schematic cross-sectional views illustrating the method for manufacturing the semiconductor device of FIG. 1;

FIG. 6B is an enlarged plan view illustrating the method for manufacturing the semiconductor device of FIG. 1;

FIG. 7A is an enlarged plan view illustrating the method for manufacturing the semiconductor device of FIG. 1;

FIG. 7B is a schematic cross-sectional view illustrating the method for manufacturing the semiconductor device of FIG. 1;

FIGS. 8A, 8B, 9A, and 9B are schematic cross-sectional views view illustrating the method for manufacturing the semiconductor device of FIG. 1;

FIGS. 12A and 12B are schematic cross-sectional views illustrating a method for manufacturing the semiconductor device of FIG. 10;

DESCRIPTION OF THE EMBODIMENTS

Figure 1:
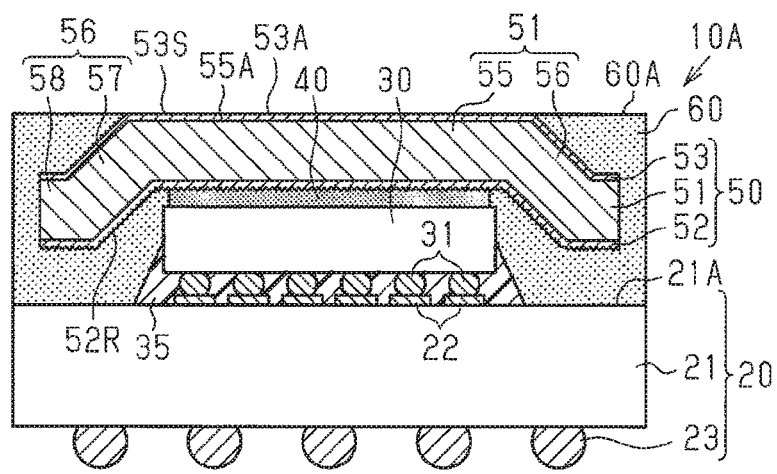
FIG. 1 is a schematic cross-sectional view illustrating a first embodiment of a semiconductor device (cross-sectional view taken along line 1-1 in FIG. 2)

Embodiments will now be described with reference to the drawings. In the drawings, elements are illustrated for simplicity and clarity and have not necessarily been drawn to scale. To facilitate understanding, hatching lines may not be illustrated or be replaced by shading in the cross-sectional drawings.

First Embodiment

A first embodiment will now be described with reference to FIGS. 1 to 9B.

As illustrated in FIG. 1, a semiconductor device 10A includes a wiring substrate 20 of a ball grid array (BGA) type, a semiconductor element 30 mounted on an upper surface of the wiring substrate 20, a heat dissipation plate 50 arranged on the semiconductor element 30 with an adhesive 40 located in between, and an encapsulation resin 60 encapsulating the semiconductor element 30 and the like.

The wiring substrate 20 includes a substrate body 21, connection pads 22, and solder balls 23. The substrate body 21 has a substrate internal structure in which the connection pads 22 and the solder balls 23 are electrically connected to each other. For example, the substrate internal structure may or may not include wiring layers. For example, the substrate internal structure includes a plurality of wiring layers, one or more insulation interlayers, which are respectively located between each two adjacent wiring layers, and one or more via wirings, which are formed in each insulation interlayer. In this structure, the wiring layers and the via wirings electrically connect the connection pads 22 and the solder balls 23. When the substrate internal structure does not include wiring layers, for example, through electrodes extend through the substrate body 21 in the thickness-wise direction to electrically connect the connection pads 22 and the solder balls 23. The substrate body 21 may be a build-up core substrate, which has a core substrate, or a coreless substrate, which does not have a core substrate.

The connection pads 22 are arranged on an upper surface 21A of the substrate body 21. The material of the connection pads 22 may be, for example, copper (Cu) or an alloy of copper. The solder balls 23 are arranged on a lower surface of the substrate body 21. The material of the solder balls 23 may be, for example, an alloy containing lead (Pb), an alloy of tin (Sn) and Cu, an alloy of Sn and silver (Ag), or an alloy of Sn, Ag, and Cu. For example, the solder balls 23 function as external connection terminals, which are connected to, for example, a mounting substrate such as a motherboard.

For example, the semiconductor element 30 includes a semiconductor integrated circuit (not illustrated), which is formed on a circuit formation surface (lower surface in FIG. 1) of a thin semiconductor substrate formed from silicon (Si) or the like. The circuit formation surface is coated by a passivation film (not illustrated), and connection terminals 31 are arranged on the circuit formation surface.

For example, the semiconductor element 30 may be a logic chip such as a central processing unit (CPU) chip or a graphics processing unit (GPU) chip. Further, the semiconductor element 30 may be, for example, a memory chip such as a dynamic random access memory (DRAM) chip or a flash memory chip. The semiconductor element 30 may have any planar shape and any size. For example, the semiconductor element 30 is rectangular (generally square) in a plan view. The size of the semiconductor element 30 may be, for example, approximately 10 mm×10 mm in a plan view.

For example, the semiconductor element 30 is flip-chip-mounted on the wiring substrate 20. In the present example, the semiconductor element 30 is electrically connected to the connection pads 22 of the wiring substrate 20 by the connection terminals 31. The connection terminals 31 may be, for example, gold (Au) bumps or solder bumps. The material of the solder bumps may be, for example, an alloy containing Pb, an alloy of Sn and Cu, an alloy of Sn and Ag, or an alloy of Sn, Ag, and Cu.

The gap between the lower surface (circuit formation surface) of the semiconductor element 30 and the upper surface 21A of the substrate body 21 (i.e., upper surface of wiring substrate 20) is filled with an underfill resin 35. The material of the underfill resin 35 may be, for example, an insulative resin such as an epoxy resin.

The semiconductor element 30 includes a rear surface (upper surface in FIG. 1) located at the side opposite to the circuit formation surface. The adhesive 40 is arranged on the rear surface of the semiconductor element 30. The adhesive 40 may be, for example, a silicone polymer resin or a thermal conductive member (TIM: Thermal Interface Material). The material of the thermal conductive member may be, for example, indium, which has high thermal conductivity and high electrical conductivity, or the like. Another example of the material of the thermal conductive member is silicone grease containing a material having high electrical conductivity, or an organic resin binder containing metal filler, graphite, or the like. The adhesive 40 bonds and thermally couples the semiconductor element 30 to the heat dissipation plate 50.

The heat dissipation plate 50 is arranged on the rear surface of the semiconductor element 30 with the adhesive 40 located in between. The heat dissipation plate 50 is also referred to as a heat spreader. The heat dissipation plate 50 spreads the heat generated by the semiconductor element 30 and decrease the concentration of heat. Additionally, the heat dissipation plate 50, which is arranged on the semiconductor element 30, functions to mechanically protect the semiconductor element 30.

The heat dissipation plate 50 includes a base plate 51, a metal layer 52 formed on a lower surface of the base plate 51, and a metal layer 53 formed on an upper surface of the base plate 51. It is preferred that the material of the base plate 51 have sufficient thermal conductivity. The material of the heat dissipation plate 50 may be, for example, Cu, Ag, aluminum (Al), or an alloy of these elements. In the present embodiment, Al is used. Alternatively, the base plate 51 may be formed from a material other than metal if the material has sufficient thermal conductivity. The material of the metal layers 52 and 53 may be, for example, Cu, nickel (Ni), or an alloy of these elements.

The base plate 51 includes a plate-like body 55 and a plurality (in the present example, four) of projections 56, which are formed integrally with the body 55 and project outward from an end of the body 55. The projections 56 are located downward from the body 55. Each projection 56 includes a connection portion 57, which is continuous with the body 55, and an extension 58, which is continuous with the connection portion 57. The connection portion 57 connects the body 55 to the extension 58, which is flat and located at a lower position than the body 55. For example, each connection portion 57 projects obliquely downward from the end of the body 55 toward a peripheral edge of the substrate body 21. Further, each extension 58 is bent at the lower end of the corresponding connection portion 57 to be generally horizontal and extend toward the peripheral edge of the substrate body 21. The extension 58 includes an upper surface and a lower surface. The upper surface of the extension 58 is, for example, parallel to the upper surface 55A of the body 55. The lower surface of the extension 58 is located at a lower position than the lower surface of the body 55 and the rear surface (upper surface in FIG. 1) of the semiconductor element 30. Additionally, the lower surface of the extension 58 is located at a higher position than the circuit formation surface (lower surface, in FIG. 1) of the semiconductor element 30. The body 55, each connection portion 57, and the corresponding extension 58 form a step.

Figure 2:
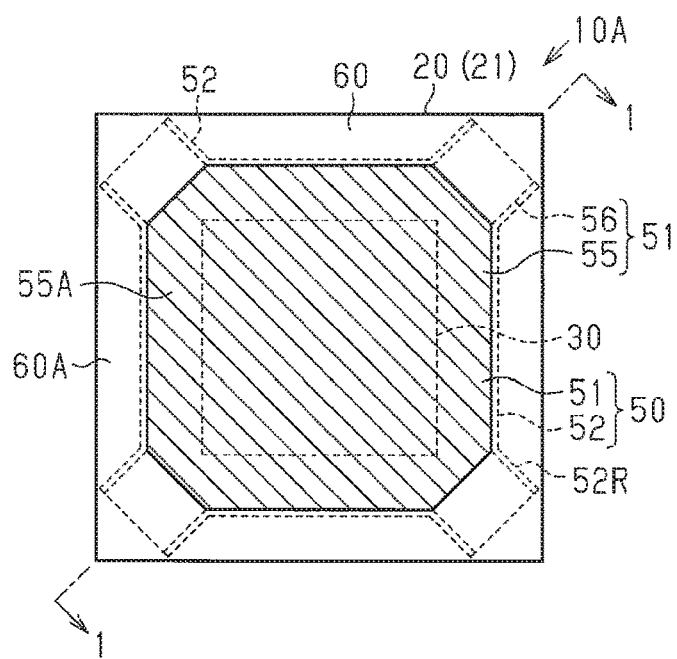
FIG. 2 is a schematic plan view illustrating the semiconductor device of FIG. 1.

As illustrated in FIG. 2, the body 55 is, for example, rectangular (generally square) in a plan view. The four corners of the body 55 are chamfered. In other words, the body 55 of the present example is octagonal in a plan view. The planar shape of the body 55 is slightly smaller than that of the substrate body 21. Additionally, the planar shape of the body 55 is slightly larger than that of the semiconductor element 30.

The projections 56 respectively project from the four chamfered corners of the body 55 toward four corners of the wiring substrate 20. In the present example, in a plan view, the projections 56 extend in directions extending along the diagonal lines of the wiring substrate 20. However, the projections 56 do not extend to the corners of the wiring substrate 20.

In this manner, the projections 56 are formed only at the corners of the body 55. In other words, in a region overlapped with a peripheral region of the wiring substrate 20 in a plan view, only the projections 56 are arranged at locations corresponding to the corners of the wiring substrate 20, and the base plate 51 is not arranged at locations corresponding to the four sides, excluding the corners, of the wiring substrate 20. FIG. 2 is a plan view of the semiconductor device 10A illustrated in FIG. 1 as seen through the metal layer 53.

Referring to FIG. 1, the metal layer 52 entirely covers the lower surface of the base plate 51. Accordingly, the metal layer 52 covers the entire lower surface of the body 55 and the entire lower surface of each projection 56 (connection portion 57 and extension 58). The metal layer 52 has a lower surface that is a roughened surface 52R. From the aspect of adhesion with the encapsulation resin 60, the roughened surface 52R has a higher surface roughness than the lower surface of the base plate 51. The roughened surface 52R may have, for example, a surface roughness Ra of 0.1 μm or higher. The surface roughness Ra is referred to as the arithmetic average roughness that is an arithmetic average obtained by measuring the absolute value of heights, which vary, from a surface serving as a mean line in a measurement region.

The lower surface of the metal layer 52 covering the lower surface of the body 55 is thermally coupled to the rear surface of the semiconductor element 30 by the adhesive 40. This dissipates the heat generated from the semiconductor element 30 through the adhesive 40 to the heat dissipation plate 50.

Referring to FIG. 2, the metal layer 52 partially covers the side surfaces of the base plate 51. In the present example, the metal layer 52 entirely covers the side surfaces of the body 55 and entirely covers the side surfaces of the projections 56 extending in directions extending along the diagonal lines of the wiring substrate 20. Each projection 56 has a distal end (end facing a corresponding corner of the wiring substrate 20) including a side surface that is exposed from the metal layer 52. In other words, the distal end surface of each projection 56 is exposed from the metal layer 52. Accordingly, the metal layer 52 entirely covers the side surfaces of the base plate 51 except for the distal end surface of each projection 56. In the same manner as the lower surface of the metal layer 52 covering the lower surface of the base plate 51, the surface (side surface) of the metal layer 52 covering the side surfaces of the base plate 51 is the roughened surface 52R.

Referring to FIG. 1, the metal layer 53 entirely covers the upper surface of the base plate 51. Accordingly, the metal layer 53 covers the entire upper surface 55A of the body 55 and the entire upper surface of each projection 56 (connection portion 57 and extension 58). The upper surface of the metal layer 53 is a smooth surface 53S (low surface roughness surface) having a lower surface roughness than the roughened surface 52R of the metal layer 52. The smooth surface 53S has, for example, a surface roughness Ra of approximately 15 to 100 nm.

The encapsulation resin 60 is formed on the upper surface 21A of the substrate body 21 to encapsulate the semiconductor element 30 and the heat dissipation plate 50. The encapsulation resin 60, for example, entirely covers the semiconductor element 30 and the projections 56 of the heat dissipation plate 50. The gaps between the heat dissipation plate 50 and the wiring substrate 20 is filled with the encapsulation resin 60. The encapsulation resin 60, for example, entirely covers the surfaces of the semiconductor element 30 exposed from the underfill resin 35 and the adhesive 40. The encapsulation resin 60 also covers the upper surface, lower surface, and side surface of each projection 56. In the present example, the encapsulation resin 60 entirely covers the surfaces (lower surface and side surfaces) of the metal layer 52 covering the lower surface and side surfaces of each projection 56, the surfaces (upper surface and side surfaces) of each projection 56, and the distal end surface of each projection 56 exposed from the metal layers 52 and 53. Thus, the surfaces of the metal layers 52 and 53, which are formed on the surfaces of the projections 56, and the distal end surfaces of the projections 56 are not exposed to the outside from the side surfaces of the semiconductor device 10A. The encapsulation resin 60 formed on the peripheral region of the substrate body 21 covers the side surfaces of the metal layer 52, which covers the side surfaces of the body 55. The encapsulation resin 60 includes an upper surface 60A that is, for example, flush with an upper surface 53A of the metal layer 53, which covers the upper surface of the body 55. In other words, the upper surface 55A of the body 55 and the upper surface 53A of the metal layer 53 are exposed from the encapsulation resin 60. Outer side surfaces of the encapsulation resin 60 are generally flush with outer side surfaces of the substrate body 21.

In this manner, the encapsulation resin 60 fixes the heat dissipation plate 50 to the wiring substrate 20 and encapsulates the semiconductor element 30. Thus, the encapsulation resin 60 functions as an adhesive, which bonds the heat dissipation plate 50 to the wiring substrate 20, and also as a protection layer, which protects the semiconductor element 30. Further, the encapsulation resin 60 increases the mechanical strength of the entire semiconductor device 10A. This allows the wiring substrate 20 and the heat dissipation plate 50 to be decreased in thickness. Thus, the thickness of the entire semiconductor device 10A may be decreased.

The material of the encapsulation resin 60 may be, for example, an insulative resin such as an epoxy resin or a polyimide resin. Alternatively, the material of the encapsulation resin 60 may be, for example, a resin material obtained by mixing filler into an epoxy resin or a polyimide resin. The filler may be a known inorganic compound such as silica, an organic compound, or the like. The encapsulation resin 60 may also be, for example, a mold resin.

A method for manufacturing the semiconductor device 10A will now be described. For the sake of brevity, portions that ultimately become elements of the semiconductor device 10A are indicated by reference characters used to denote the final elements.

In the step illustrated in FIGS. 3A and 3B, the wiring substrate 20 is prepared. A large substrate is used as the wiring substrate 20 so that a batch of semiconductor devices 10 can be manufactured. In the present example, the substrate body 21 includes a plurality of separate regions C1 arranged in a matrix (4×3, in FIG. 3A). Each separate region C1 includes a structure that corresponds to the semiconductor device 10A. The large substrate body 21 is ultimately cut into individual semiconductor devices 10A with a dicing blade or the like along the cutting lines D1, which are indicated by broken lines.

Referring to FIG. 3B, each separate region C1 has a structure including the substrate body 21 and the connection pads 22 formed on the upper surface 21A of the substrate body 21. The structure may be manufactured using a known manufacturing process. Thus, the manufacturing process will not be described here.

In each separate region C1, the connection terminals 31 of the semiconductor element 30 are flip-chip-joined to the connection pads 22. Then, the underfill resin 35 is formed between the upper surface 21A of the substrate body 21 and the circuit formation surface of the semiconductor element 30.

In the step illustrated in FIG. 4, the adhesive 40 is arranged on the rear surface (upper surface, in FIG. 4) of each semiconductor element 30. For example, a thermosetting adhesive 40 is applied to the rear surface of each semiconductor element 30.

As illustrated in FIG. 5A, a large heat dissipation plate 70, which includes a plurality of base plates 51 connected to each other, is prepared. The heat dissipation plate 70 includes a plurality of separate regions E1 arranged in a matrix (4×3, in FIG. 5A) at locations corresponding to the separate regions C1 of the substrate body 21 (refer to FIG. 3A). That is, the separate regions E1 are arranged at positions overlapping the separate regions C1 (refer to FIG. 3A) in a plan view. The heat dissipation plate 70 includes a frame 71, which surrounds the separate regions E1.

Each separate region E1 includes the base plate 51. The base plate 51 includes the body 55 in the generally central portion of the separate region E1 and the projections 56 which respectively project from four corners of the body 55 toward four corners of the separate region E1. In other words, each separate region E1 includes openings 70X which define the body 55 and the projections 56. The openings 70X are formed between adjacent separate regions E1. The opening 70X of each separate region E1 separates the bodies 55 of the adjacent base plates 51. The openings 70X result in the peripheral region of each separate region E1, in which the boundary between separate regions E1 extend (refer to broken lines), including only the projections 56 of the corresponding base plate 51.

Each projection 56 of each base plate 51 is connected to the projection 56 of the adjacent base plate 51 or to the frame 71. In other words, each base plate 51 is connected to the adjacent base plate 51 by the corresponding projections 56, and each base plate 51 located at the outer side is connected to the frame 71 by the corresponding projections 56. Thus, in the heat dissipation plate 70, the projections 56 function as suspenders, which support the bodies 55. The projections 56 are, for example, processed so that the projections 56 and the bodies 55 form the steps (refer to FIG. 5B). As described above, each projection 56 includes the connection portion 57, obliquely extending downward from the end of the body 55, and the extension 58, extending generally parallel to the body 55. The large heat dissipation plate 70 is manufactured, for example, through a stamping process, a forging process, a machining process, or the like. For example, a metal plate is punched out and then pressed to manufacture the heat dissipation plate 70.

In the step illustrated in FIG. 6A, the metal layer 52, which has a surface defining the roughened surface 52R, is formed on the lower surface of the large heat dissipation plate 70. This forms the roughened lower surface of the heat dissipation plate 70 (base plates 51 and frame 71). The material of the metal layer 52 may be, for example, Cu, Ni, an alloy of Cu and Ni, or the like. In the present embodiment, Ni is used as the material of the metal layer 52. The metal layer 52 may have a thickness of, for example, 1 to 10 μm. Preferably, the roughened surface 52R has a surface roughness Ra of, for example, 0.1 μm or higher. One example of a method for forming the metal layer 52 will now be described.

An electrolytic plating (electrolytic Ni plating), which is used as a plating power supplying layer, is applied to the heat dissipation plate 70, and the metal layer 52 (roughened-surface plating layer) is formed on the lower surface of the heat dissipation plate 70. To set the surface roughness of the roughened surface 52R of the metal layer 52 to the value described above, the composition and current density of the plating liquid used for the electrolytic plating need to be adjusted in a suitable manner.

One example of the conditions for forming a metal layer 52 of Ni will now be described. When using a nickel chloride plating bath as the plating liquid, the composition of the plating bath and the plating conditions are as described below.

Nickel chloride plating bath:
Nickel chloride 75 g/L
Sodium thiocyanate 15 g/L
Ammonium chloride 30 g/L
Boric acid 30 g/L
pH: approximately 4.5 to 5.5
Bath temperature: room temperature (approximately 25° C.)
Processing time: approximately 1 to 30 minutes
Cathode current density: approximately 1 to 3 A/dm$^2$ The adjustment of the composition, current density, and the like of the used plating liquid in a suitable manner as described above forms the surface of the metal layer 52 as the roughened surface 52R and sets the roughness of the roughened surface 52R to the desired surface roughness. The composition of the plating liquid and the plating conditions are not limited to the example described above and may be changed as long as the roughened surface 52R of the metal layer 52 obtains the desired surface roughness.

With the electrolytic plating described above, for example, a resist layer (not illustrated) is formed on the entire upper surface of the heat dissipation plate 70 so that the metal layer 52 is not formed on the upper surface of the heat dissipation plate 70, and a plating process is performed using the resist layer as a mask. The resist layer is formed exposing the side surfaces of the heat dissipation plate 70 (side surfaces of heat dissipation plate 70 exposed to outside from openings 70X illustrated in FIG. 5A) are exposed to the outside. Thus, referring to FIG. 6B, the electrolytic Ni plating described above forms the metal layer 52, which has a surface defining the roughened surface 52R, on the side surfaces of the heat dissipation plate 70 that are exposed to the outside from the openings 70X.

Then, in the step illustrated in FIG. 6C, the metal layer 53, which has a surface defining the smooth surface 53S, is formed on the upper surface of the heat dissipation plate 70. The material of the metal layer 53 may be, for example, Cu, Ni, an alloy of Cu and Ni, or the like. In the present embodiment, Ni is used as the material of the metal layer 53. The metal layer 53 may have a thickness of, for example, 1 to 10 μm. Preferably, the smooth surface 53S has a surface roughness Ra of, for example, approximately 15 to 100 nm. One example of a method for forming the metal layer 53 will now be described.

For example, an electrolytic plating (electrolytic Ni plating), which is used as a plating power supplying layer, is applied to the heat dissipation plate 70, and the metal layer 53 (smooth-surface plating layer) is formed on the upper surface of the heat dissipation plate 70. A resist layer (not illustrated) is formed on the entire surface of the metal layer 52 so that the metal layer 53 is not formed on the surface of the metal layer 52. Further, an electrolytic plating process is performed using the resist layer as a mask.

One example of the conditions for forming a metal layer 53 of Ni will now be described. When using a nickel sulfamate plating bath as the plating liquid, the composition of the plating bath and the plating conditions are as described below.

Nickel sulfamate plating bath:
Nickel sulfamate 320 g/L
Boric acid 30 g/L
Nickel bromide 10 g/L
pH: approximately 3.0 to 4.0
Bath temperature: approximately 30° C. to 50° C.
Cathode current density: approximately 3 to 30 A/cm$^2$ The adjustment of the composition, current density, and the like of the used plating liquid in a suitable manner as described above forms the surface of the metal layer 53 as the smooth surface 53S and sets the roughness of the smooth surface 53S to the desired surface roughness. The composition of the plating liquid and the plating conditions are not limited to the example described above and may be changed as long as the smooth surface 53S of the metal layer 53 obtains the desired surface roughness.

The manufacturing steps described above forms the heat dissipation plate 50, which includes the base plate 51 and the metal layers 52 and 53, in each separate region E1.

Then, in the step illustrated in FIGS. 7A and 7B, each projection 56 is cut at an intermediate portion in each separate region E1 to divide the heat dissipation plate 70 into a plurality of heat dissipation plates 50. In the present example, as illustrated in FIGS. 7A and 7B, the extension 58 of each projection 56 and the metal layers 52 and 53 covering the extension 58 are cut at an intermediate portion of the extension 58 in the extending direction of the extension 58 to form an opening 70Y, through which the adjacent openings 70X are in communication. This separates each heat dissipation plate 50 from the adjacent heat dissipation plate 50 or the frame 71 and singulates the large heat dissipation plate 70 into separate heat dissipation plates 50. Further, the distal end surface (i.e., cut surface) of each projection 56 (extension 58) is exposed to the outside. Thus, the metal layers 52 and 53 are not formed on the distal end surface of each projection 56.

The opening 70Y may be formed through a pressing process, which uses a die, or a laser cutting process. When performing a pressing process with a die, for example, a predetermined portion of the extension 58 is pressed and punched out with a punch (not illustrated) of the die to cut the predetermined portion of the extension 58. FIG. 7B illustrates a state in which a predetermined portion of the extension 58 punched out by a die is placed on a lower die 72.

Figure 8A:
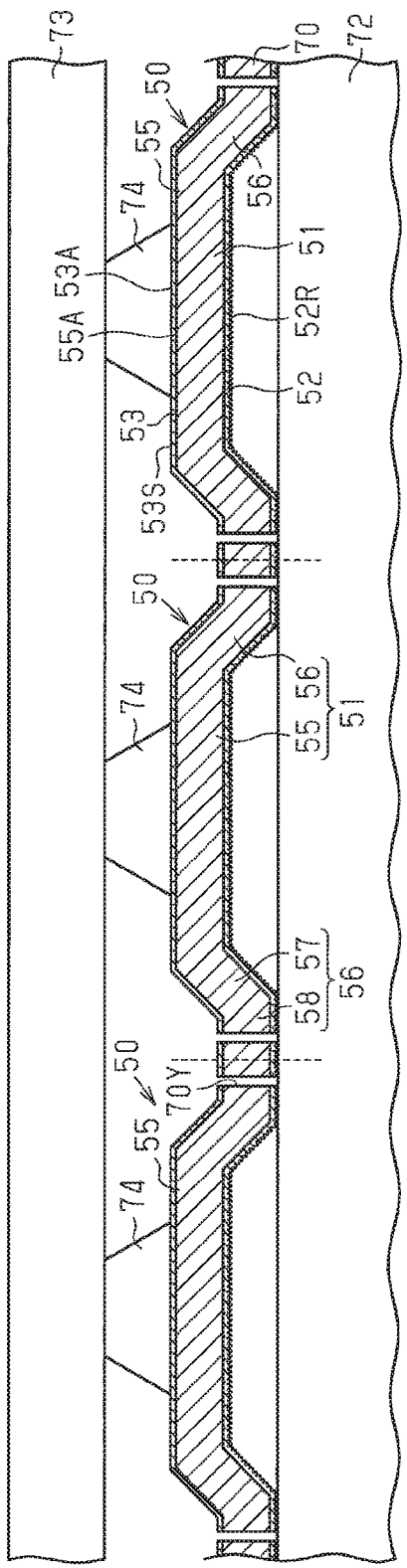

Then, in the step illustrated in FIG. 8A, a transport device 73 simultaneously lifts all of the heat dissipation plates 50 that are on the lower die 72. The transport device 73 includes suction pads 74 that are arranged in accordance with the positions of the plurality of (4×3) heat dissipation plate 50 that have been separated from one another. The suction pads 74 are connected to, for example, a vacuum pump (not illustrated). The vacuum pump functions so that the suction pads 74 attract the upper surfaces of the separated heat dissipation plates 50 (upper surfaces 53A of metal layers 53 covering upper surfaces 55A of bodies 55). This simultaneously attracts and fixes the multiple (in this case, twelve), separated heat dissipation plates 50 to the transport device 73 and lifts the heat dissipation plates 50.

Figure 8B:
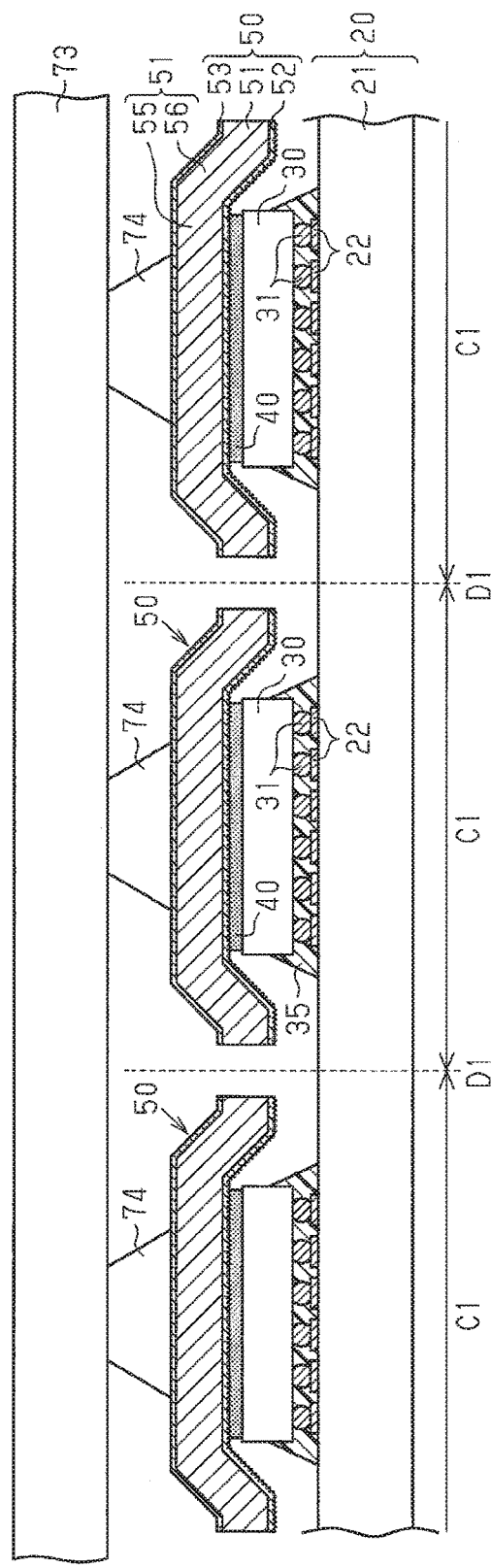

Then, in the step illustrated in FIG. 8B, the transport device 73, to which the heat dissipation plates 50 have been attracted, is moved to carry the heat dissipation plates 50 to a location above the wiring substrate 20. The heat dissipation plates 50 are positioned relative to the wiring substrate 20 so that the twelve (4×3) heat dissipation plates 50, which are attracted and fixed to the transport device 73, are aligned in the vertical direction with the twelve (4×3) separate regions C1 of the wiring substrate 20. That is, each heat dissipation plate 50 is arranged above the corresponding semiconductor element 30 so that the lower surface of the body 55 of each heat dissipation plate 50 (lower surface of metal layer 52 covering lower surface of body 55) is opposed to the rear surface of the corresponding semiconductor element 30 and so that the projections 56 of each heat dissipation plate 50 are arranged along the diagonal lines of the corresponding separate region C1. Each heat dissipation plate 50 is located inside the corresponding separate region C1 and does not lie along the cutting line D1.

Then, the vacuum pump is stopped to release the heat dissipation plates 50 from the suction pads 74 and remove the heat dissipation plates 50 from the transport device 73. In the step illustrated in FIG. 9A, each heat dissipation plate 50 is bonded to the rear surface of each semiconductor element 30 with the adhesive 40. For example, heat and pressure is applied to the wiring substrate 20, the adhesive 40, and the heat dissipation plates 50 to cure the adhesive 40 with the lower surface of the body 55 of each heat dissipation plate 50 in contact with the adhesive 40. This bonds the heat dissipation plates 50 to the semiconductor elements 30 with the adhesive 40. For example, a structure obtained by arranging the heat dissipation plates 50 on the rear surfaces of the corresponding semiconductor elements 30 is arranged between two press heating plates. Then, heat and pressure is applied to the upper and lower sides of the structure with a vacuum press to obtain the integrated structure illustrated in FIG. 9A.

In the steps described above, the multiple (in this case, twelve), separated heat dissipation plates 50 are simultaneously arranged on the semiconductor elements 30 and simultaneously bonded to the semiconductor elements 30. This bonds the heat dissipation plates 50 with fewer steps than when bonding the heat dissipation plates 50 to the corresponding semiconductor elements 30 one at a time.

In the step illustrated in FIG. 9B, the encapsulation resin 60 is formed on the upper surface 21A of the substrate body 21 to encapsulate the semiconductor elements 30 and the heat dissipation plates 50. The encapsulation resin 60 covers the lower surface and the side surfaces of each body 55. The encapsulation resin 60 also covers the upper, lower, and side surfaces of each projection 56, which is located at a lower position than the corresponding body 55. In the present example, the encapsulation resin 60 covers the surface of the metal layer 52, which covers the lower and side surfaces of the body 55 and the lower and side surfaces of each projection 56, the surface of the metal layer 53, which covers the upper surface of each projection 56, and the distal end surface of each projection 56 exposed from the metal layers 52 and 53. The upper surface 60A of the encapsulation resin 60, which is formed in the peripheral region of each separate region C1, is generally flush with the upper surface 55A of the body 55. The encapsulation resin 60 firmly fixes the wiring substrate 20 and the heat dissipation plate 50. Further, the encapsulation resin 60 encapsulates the semiconductor element 30.

For example, when a thermosetting mold resin is used as the material of the encapsulation resin 60, the structure illustrated in FIG. 9A is arranged in a mold, and pressure (e.g., 5 to 10 MPa) is applied to the mold to charge the mold with fluid mold resin. Subsequently, the mold resin is heated and cured at a temperature of approximately 180° C. to form the encapsulation resin 60. Examples of a process for charging the mold resin include transfer molding, compression molding, injection molding, and the like.

Then, the solder balls 23 are formed on the lower surface of the substrate body 21 in each separate region C1. Through the above manufacturing steps, a structure that corresponds to the semiconductor device 10A may be manufactured in each separate region C1.

Subsequently, the structure illustrated in FIG. 9B is cut along the cutting lines D1 with a dicing blade or the like. In the present example, the substrate body 21 and the encapsulation resin 60 are cut along the cutting lines D1. This manufactures the semiconductor devices 10A. Subsequent to the singulation, the outer surfaces of the substrate body 21 and the outer surfaces of the encapsulation resin 60 are exposed from the cut surface of each semiconductor device 10A.

In the structure illustrated in FIG. 9B, the heat dissipation plate 50 is not located on the cutting lines D1 (cutting region). This limits the formation of burrs (metal burrs) in the cut surface regardless of whether the dicing blade cuts the substrate body 21 from the lower surface of the substrate body 21 or from the upper surface 60A of the encapsulation resin 60.

The present embodiment has the advantages described below.

(1) The semiconductor element 30 is flip-chip-mounted on the wiring substrate 20. The heat dissipation plate 50 is bonded to the rear surface of the semiconductor element 30 with the adhesive 40. The encapsulation resin 60 fills the gap between the heat dissipation plate 50 and the wiring substrate 20. The encapsulation resin 60 increases the mechanical strength of the entire semiconductor device 10A. This effectively reduces warping of the semiconductor device 10A. Further, the wiring substrate 20 and the heat dissipation plate 50 may be decreased in thickness. Thus, the semiconductor device 10A may be entirely decreased in thickness.

(2) The encapsulation resin 60 covers the upper, lower, and side surfaces of each projection 56, which is part of the heat dissipation plate 50. Thus, the projection 56 is embedded in the encapsulation resin 60. This restricts separation of the heat dissipation plate 50 from the semiconductor element 30.

(3) The encapsulation resin 60 covers the distal end surface of each projection 56 (extension 58). Thus, the distal end surface of each projection 56 is not exposed to the outside from the outer surfaces of the semiconductor device 10A. This limits deterioration in the outer appearance quality of the semiconductor device 10A that would be caused by oxidation of the distal end surface of the projection 56.

(4) The heat dissipation plate 50 includes a lower surface defining the roughened surface 52R that contacts the encapsulation resin 60. This produces an anchor effect that improves the adhesion of the heat dissipation plate 50 and the encapsulation resin 60. This restricts separation of the heat dissipation plate 50 from the semiconductor element 30 and the encapsulation resin 60 in a preferred manner.

(5) The heat dissipation plate 50 includes an upper surface defining the smooth surface 53S that has a lower surface roughness than the roughened surface and is exposed from the upper surface of the encapsulation resin 60. Thus, when forming an identification mark in, for example, the upper surface of the semiconductor device 10A, the identification mark may be formed in the upper surface (smooth surface) of the heat dissipation plate 50. This improves the visibility of the identification mark. Examples of an identification mark includes an identification number, coordinate information, a lot number, a serial number, a product name, or an identification mark (alignment mark).

(6) The body 55 has a larger outer shape (planar shape) than the semiconductor element 30. The upper surface 55A of the body 55 is exposed from the encapsulation resin 60. Thus, the heat, which is generated by the semiconductor element 30, is efficiently dissipated from the heat dissipation plate 50 (body 55) into the atmosphere. This improves the heat dissipation performance of the semiconductor device 10.

(7) When singulating the semiconductor devices 10A, if the heat dissipation plate 50 lies on the cutting lines D1, burrs may form in the cut surfaces of the heat dissipation plate 50. In contrast, the encapsulation resin 60, the wiring substrate 20, and the like are cut along the cutting lines D1 in the present embodiment with the heat dissipation plate 50 separated from the cutting lines D1. This limits the formation of burrs in the cut surfaces.

(8) The large heat dissipation plate 70, in which the base plates 51 (heat dissipation plates 50) are connected to one another, includes the openings 70X between the adjacent heat dissipation plates 50. Thus, the adjacent heat dissipation plates 50 are connected to one another by the projections 56, which project from only the corners of each body 55. This decreases the cut amount of the projections 56 (heat dissipation plates 50) when singulating the base plates 51 (heat dissipation plates 50) as compared with when the projection extends over the entire periphery of each body 55. Thus, the manufacturing time is shortened and manufacturing costs are lowered. Damages inflicted to the dicing blade may also be decreased when cutting the heat dissipation plates 50.

(9) The transport device 73 simultaneously attracts all of the separated heat dissipation plates 50 and carries the attracted heat dissipation plates 50 to locations above the semiconductor elements 30. Then, the heat dissipation plates 50 are simultaneously bonded to the semiconductor elements 30. This bonds the heat dissipation plates 50 with fewer steps than when bonding the heat dissipation plates 50 to the semiconductor elements 30 one at a time. As a result, the manufacturing time is shortened, and the manufacturing costs are lowered.

Second Embodiment

A second embodiment will now be described with reference to FIGS. 10 to 13. The second embodiment differs from the first embodiment in the structure of the projection 56. The description hereafter will focus on the differences from the first embodiment. The same reference characters are given to those components that are the same as the corresponding components illustrated in FIGS. 1 to 9B. Such components will not be described in detail.

Figure 10:
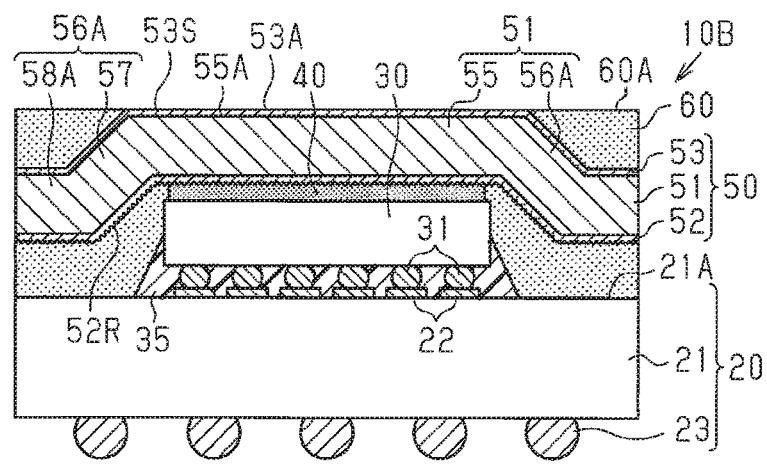
FIG. 10 is a schematic cross-sectional view illustrating a second embodiment of a semiconductor device (cross-sectional view taken along line 10-10 in FIG. 11).

Referring to FIG. 10, the heat dissipation plate 50 of a semiconductor device 10B includes projections 56A. Each projection 56A includes the connection portion 57, which extends obliquely downward from the end of a corresponding corner of the main body 55, and an extension 58A, which extends horizontally outward from an end of the connection portion 57.

Figure 11:
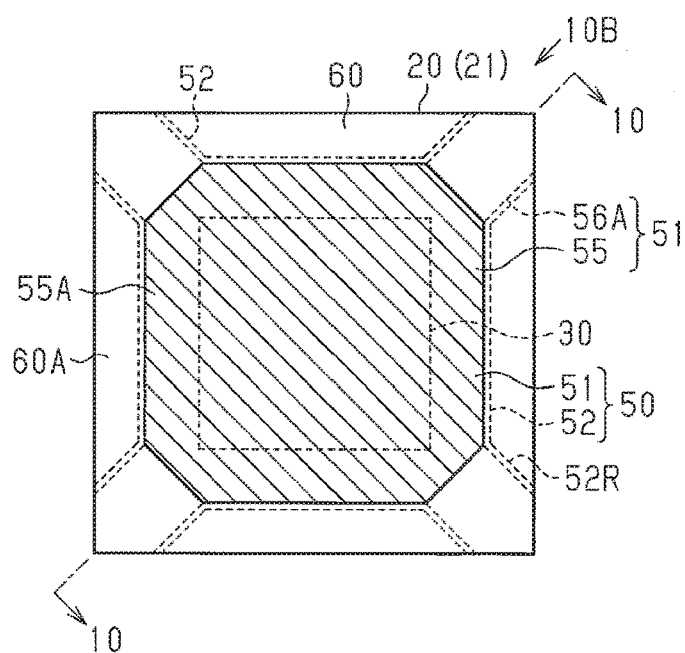
FIG. 11 is a schematic plan view illustrating the semiconductor device of FIG. 10.

Referring to FIG. 11, each projection 56A projects from a chamfered corner of the main body 55 toward a corresponding corner of the wiring substrate 20. In the present example, each projection 56A extends along a diagonal line of the wiring substrate 20 in a planar view. The distal end of each projection 56A (extension 58A) extends to the corresponding corner of the wiring substrate 20.

Referring to FIG. 10, each projection 56A (extension 58A) includes a distal end surface (outer surface) exposed from a side surface of the semiconductor device 10B. The distal end surface of the projection 56A is not covered by the encapsulation resin 60 and exposed from the encapsulation resin 60. Further, the distal end surface of each projection 56A is not covered by the metal layers 52 and 53 and exposed from the metal layers 52 and 53. For example, the distal end surface of each projection 56A (extension 58A) is exposed from the encapsulation resin 60 at an intermediate position in the thickness-wise direction of the encapsulation resin 60. The distal end surface of each projection 56A is generally flush with the outer side surface of the encapsulation resin 60 and the outer side surface of the substrate body 21.

The encapsulation resin 60 fills the gap between the lower surface of the heat dissipation plate 50 and the upper surface 21A of the substrate body 21. The encapsulation resin 60 covers the lower surface of the metal layer 52 that covers the lower surface of each projection 56A (connection portion 57 and extension 58A). Further, the encapsulation resin 60 covers the upper surface of the metal layer 53 that covers the upper surface of each projection 56A.

A method for manufacturing the semiconductor device 10B will now be described.

In the step illustrated in FIG. 12A, the heat dissipation plate 50, which includes the base plate 51 and the metal layers 52 and 53, is formed in each separate region E1 of the large heat dissipation plate 70 in the same manner as the steps illustrated in FIGS. 5A and 6C.

In the step illustrated in FIG. 12B, the large heat dissipation plate 70 is arranged on the wiring substrate 20. In the present example, the heat dissipation plate 70 is arranged on the wiring substrate 20 so that the twelve (4×3) separate regions C1 of the wiring substrate 20 are aligned in the vertical direction with the twelve (4×3) separate regions E1 of the heat dissipation plate 70. That is, the heat dissipation plate 70 is arranged on the semiconductor element 30 so that the lower surface of the main body 55 of each heat dissipation plate 50 is opposed to the rear surface of the corresponding semiconductor element 30 and so that the extension 58A of each heat dissipation plate 50 is opposed to the upper surface 21A of the substrate body 21 where the boundary (i.e., cutting line D1) of the corresponding separate region C1 is located. In each heat dissipation plate 50, only the extension 58A is located above the cutting line D1.

Then, the heat dissipation plate 70 is bonded to the rear surface of the semiconductor element 30 by the adhesive 40. For example, heat and pressure is applied to the wiring substrate 20, the adhesive 40, and the heat dissipation plate 70 that are arranged as described above. This cures the adhesive 40 with the lower surface of the main body 55 of each heat dissipation plate 50 (lower surface of metal layer 52 covering lower surface of main body 55) in contact with the adhesive 40. Consequently, the heat dissipation plate 70 (heat dissipation plates 50) are bonded to the semiconductor elements 30 by the adhesive 40.

In the step illustrated in FIG. 12B, the large heat dissipation plate 70, in which the heat dissipation plates 50 are connected, is bonded to the semiconductor element 30. Thus, the multiple (here, twelve) heat dissipation plates 50 may be simultaneously bonded to the semiconductor elements 30 in the separate regions C1. Accordingly, the heat dissipation plates 50 are bonded through fewer steps than when the separately cut heat dissipation plates 50 are separately bonded to the semiconductor elements 30.

Figure 13:
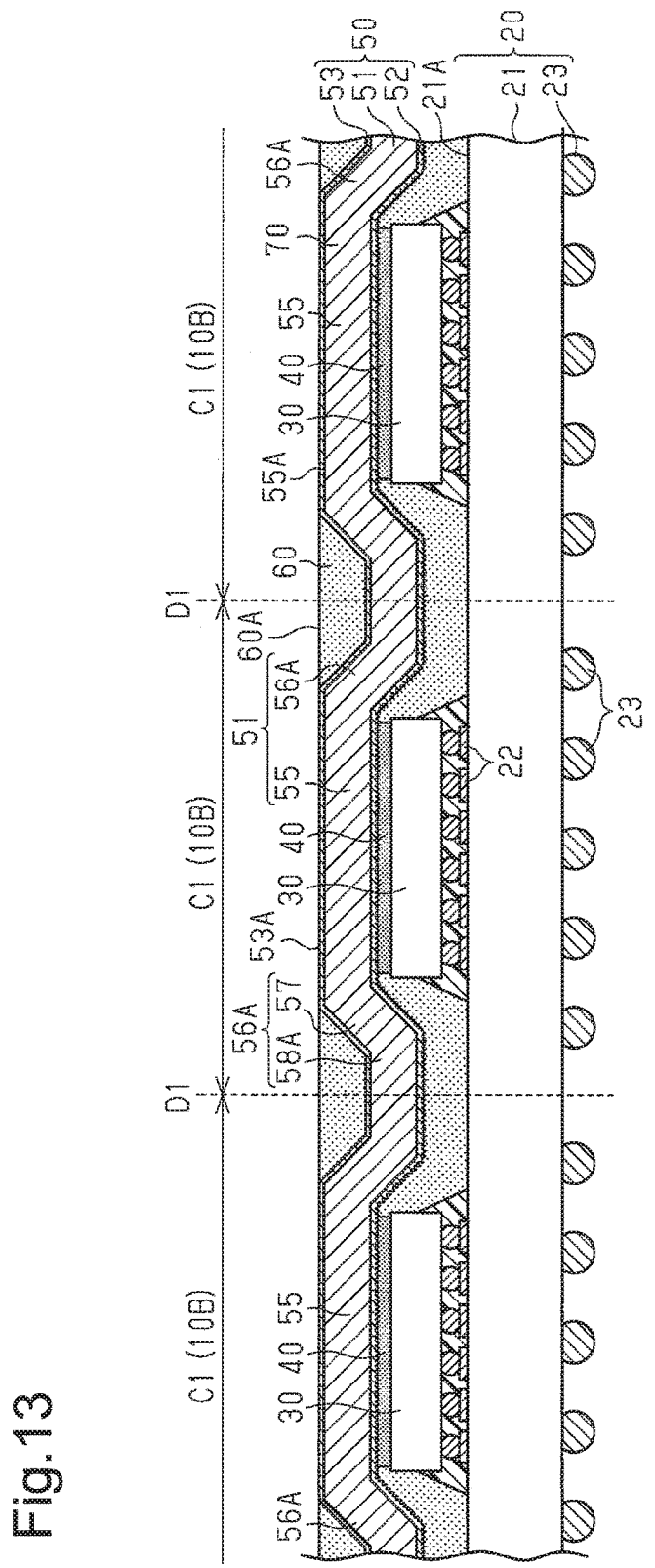
FIG. 13 is a schematic plan view illustrating the method for manufacturing the semiconductor device of FIG. 10.

In the step illustrated in FIG. 13, in the same manner as the step of FIG. 9B, the space between the wiring substrate 20 and the heat dissipation plate 70 and the openings 70X (refer to FIG. 7A) of the heat dissipation plate 70 are filled with the encapsulation resin 60 that covers the upper surface of the metal layer 52, which is formed on the upper surface of each projection 56A. The upper surface 60A of the encapsulation resin 60 is generally flush with the upper surface 53A of the metal layer 53, which covers the upper surface 55A of each main body 55. The encapsulation resin 60 firmly fixes the wiring substrate 20 and the heat dissipation plates 50 (heat dissipation plate 70).

Then, the solder balls 23 are formed on the lower surface of the substrate body 21 in the separate regions C1. The steps described above manufacture a structure corresponding to the semiconductor device 10B in each separate region C1.

Then, the structure illustrated in FIG. 13 is cut with a dicing blade or the like along the cutting lines D1. In the present example, the substrate body 21, the encapsulation resin 60, the extension 58A of each projection 56A, the metal layer 52 covering the lower surface of each extension 58A, and the metal layer 53 covering the upper surface of each extension 58A are cut along the cutting lines D1. This manufactures the semiconductor devices 10B. The outer side surface of the substrate body 21, the outer side surface of the encapsulation resin 60, the distal end surface (outer side surface) of each extension 58A, and the outer side surfaces of the metal layers 52 and 53 are exposed from the cut surface of each semiconductor device 10B subsequent to singulation.

In the step illustrated in FIG. 13B, cutting is performed with a dicing plate or the like from, for example, the lower surface of the substrate body 21. Here, in the structure illustrated in FIG. 13, only the extension 58A of each projection 56A in each heat dissipation plate 50 lies along the cutting line D1 (cutting region), and the encapsulation resin 60 covers the upper surface of the metal layer 53, which is formed on the extension 58A. Thus, at the cutting lines D1, the heat dissipation plate 50 (extensions 58A), which is a metal layer, and the metal layer 53 are not exposed from the upper surface of the encapsulation resin 60. This limits the formation of metal burrs in the cut surface even when the substrate body 21 is cut from the lower surface with a dicing blade.

The second embodiment has the advantages described below in addition to advantages (1), (2), and (4) to (8) of the first embodiment.

(10) The large heat dissipation plate 70A, in which the heat dissipation plates 50 are connected, is bonded to the semiconductor element 30. Thus, the multiple (here, twelve) heat dissipation plates 50 may be simultaneously bonded to the semiconductor elements 30 of the separate regions C1, respectively. Accordingly, the heat dissipation plates 50 are bonded through fewer steps than when the separately cut heat dissipation plates 50 are separately bonded to the semiconductor elements 30. As a result, the manufacturing time is shortened, and the manufacturing costs are reduced.

Third Embodiment

A third embodiment will now be described with reference to FIGS. 14A to 17B. The third embodiment differs from the first embodiment in the location of the projection 56. The description hereafter will focus on the differences from the first embodiment. The same reference characters are given to those components that are the same as the corresponding components illustrated in FIGS. 1 to 13. Such components will not be described in detail.

Figure 14A:
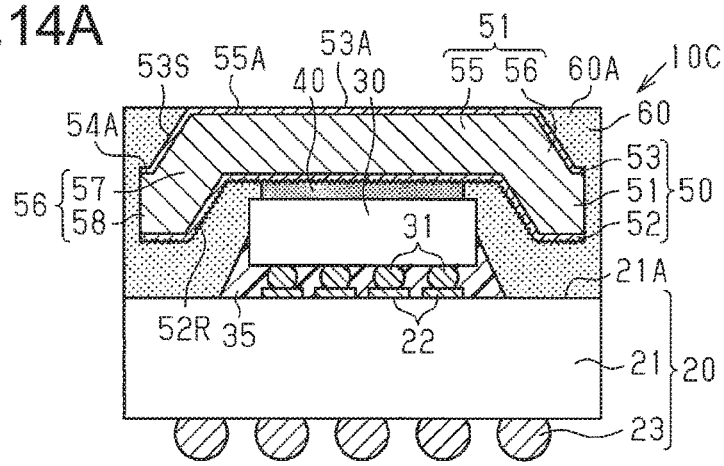
FIG. 14A is a schematic cross-sectional view illustrating a third embodiment of a semiconductor device (cross-sectional view taken along line 14a-14a in FIG. 15)

Referring to FIG. 14A, in the same manner as the first embodiment, the heat dissipation plate 50 of a semiconductor device 10C includes the base plate 51, the metal layer 52 that covers the entire lower surface of the base plate 51, and the metal layer 53 that covers the entire upper surface of the base plate 51.

Figure 15:
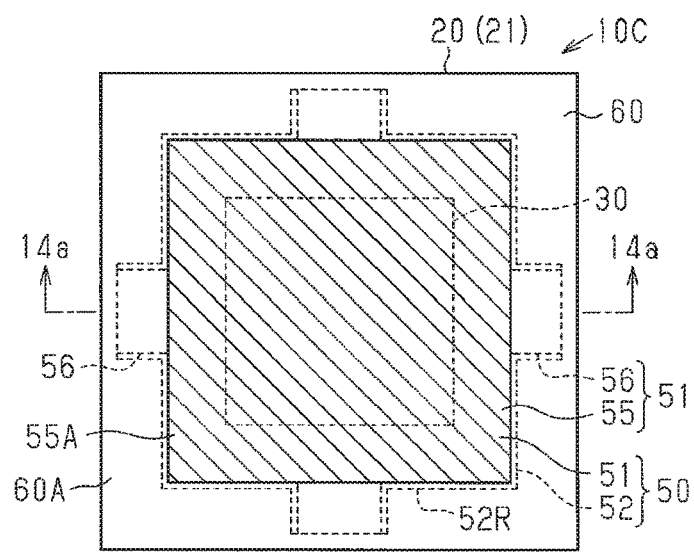
FIG. 15 is a schematic plan view illustrating the method for manufacturing the third embodiment of a semiconductor device.

Referring to FIG. 15, the body 55 of the base plate 51 is, for example, rectangular (generally square) in a plan view. The planar shape of the body 55 is slightly smaller than that of the substrate body 21 and slightly larger than that of the semiconductor element 30.

A projection 56 projects outward from each side of the body 55 at a certain location. In the present example, each projection 56 projects outward from a generally middle portion of the corresponding side of the body 55. Thus, as illustrated in FIG. 15, a region overlapped with a peripheral region of the wiring substrate 20 in a plan view includes only the projections 56, which are arranged at locations corresponding to the generally middle portions of the sides of the wiring substrate 20, and does not include other parts of the heat dissipation plate 50. FIG. 15 is a plan view of the semiconductor device 10C illustrated in FIG. 14A as seen through the metal layer 53.

Referring to FIG. 14A, each projection 56 includes the connection portion 57, which obliquely projects downward from a certain location (end) in the corresponding side of the body 55, and the extension 58, which extends outward horizontally from an end of the connection portion 57.

The metal layer 52 covers the entire lower surface of the base plate 51. That is, the metal layer 52 covers the entire lower surface of the body 55 and the entire lower surface of each projection 56 (connection portion 57 and extension 58). Further, the metal layer 52 covers the side surfaces of the base plate 51 except for the distal end surface of the projection 56. In other words, the distal end surface of each projection 56 is exposed from the metal layer 52. The metal layer 52 includes surfaces (lower surface and side surfaces) that define the roughened surface 52R.

The metal layer 53 covers the entire upper surface of the base plate 51. That is, the metal layer 53 covers the entire upper surface 55A of the body 55 and the entire upper surface of each projection 56 (connection portion 57 and extension 58). The metal layer 53 includes surfaces (upper surface and side surfaces) that define the smooth surface 53S.

Figure 14B:
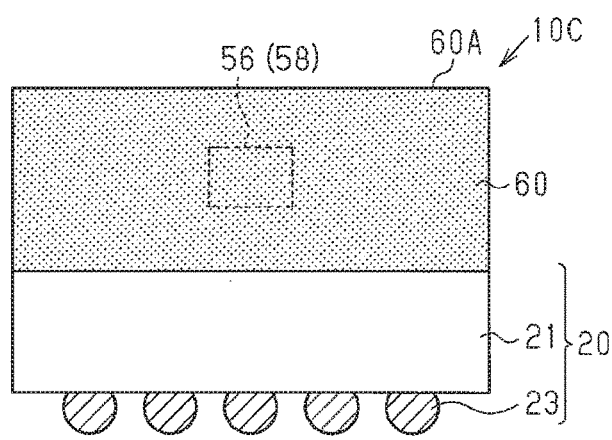
FIG. 14B is a side view illustrating the semiconductor device of FIG. 14A.

The encapsulation resin 60 covers the upper, lower, and side surfaces of each projection 56. In the present example, the encapsulation resin 60 covers the surfaces (lower surface and side surfaces) of the metal layer 52 that cover the lower surface and the side surfaces of each projection 56, the surfaces (upper surface and side surfaces) of the metal layer 53 that cover the upper surface of each projection 56, and the distal end surface of each projection 56 exposed from the metal layers 52 and 53. Referring to FIG. 14B, as viewed from an outer side surface of the encapsulation resin 60, the distal end surface of each projection 56 (extension 58) is arranged at a location corresponding to an intermediate position of the encapsulation resin 60 in the thickness-wise direction and a generally central position of the encapsulation resin 60 in the widthwise direction.

The semiconductor device 10C may be manufactured through a method similar to that of the semiconductor device 10A of the first embodiment. However, the large heat dissipation plate 70A used in the manufacturing process has a different structure. The heat dissipation plate 70A will now be described. The description will focus on the differences from the heat dissipation plate 70 used in the first embodiment.

Figure 16A:
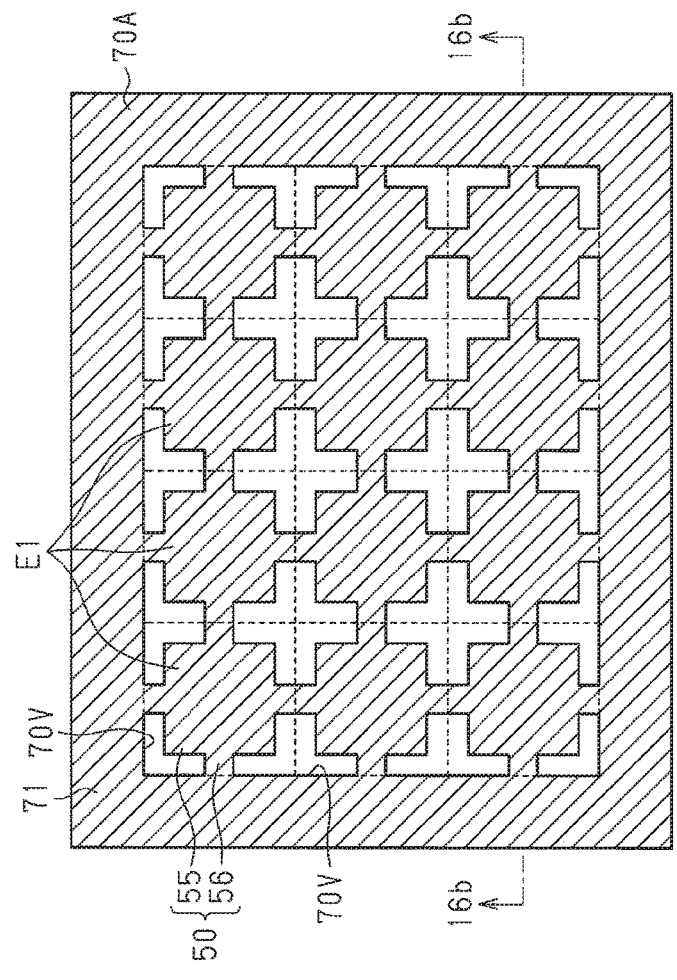
FIG. 16A is a schematic cross-sectional view illustrating a method for manufacturing the semiconductor device of FIG. 15.
Figure 16B:
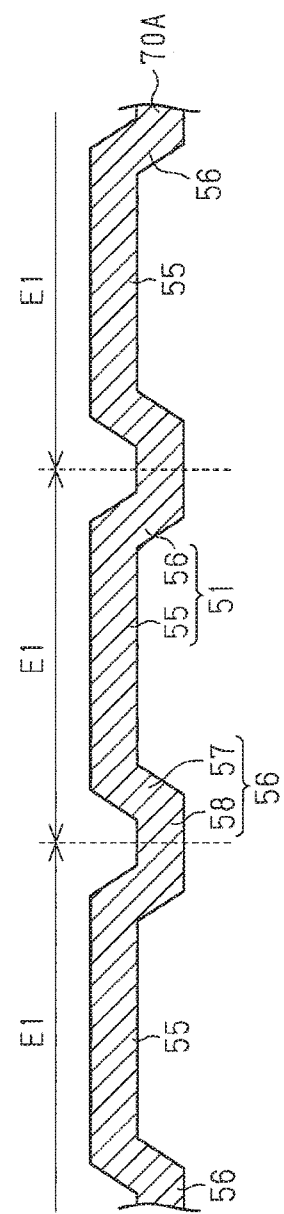
FIG. 16B is a schematic cross-sectional view illustrating the method for manufacturing the semiconductor device of FIG. 15 (cross-sectional view taken along line 16b-16b in FIG. 16A)

Referring to FIG. 16A, each separate region E1 of the heat dissipation plate 70A includes the base plate 51. The base plate 51 includes the body 55, which is formed in the separate region E1 at a generally central portion in a plan view, and the projections 56, each extending from the central portion of the corresponding side of the body 55 toward the peripheral edge of the separate region E1. In other words, each separate region E1 includes openings 70V that define the body 55 and the projections 56. The openings 70V are formed in regions between adjacent separate regions E1. The openings 70V of each separate region E1 separate the bodies 55 of adjacent base plates 51. The openings 70V are formed so that only the projections 56 of the heat dissipation plate 50 are arranged in the peripheral portion of each separate region E1 that includes the boundary (broken line) between the separate regions E1.

The projections 56 connect each base plate 51 to the adjacent base plate 51. The projections 56 of the outer base plates 51 are connected to the frame 71. In this manner, in the heat dissipation plate 70A, the projections 56 extending toward the right and left sides and toward the upper and lower sides as viewed in FIG. 16A connect the adjacent base plates 51 (bodies 55). The projections 56 are, for example, processed so that the projections 56 and the bodies 55 form steps (refer to FIG. 16B). The large heat dissipation plate 70A is manufactured, for example, through a stamping process, a forging process, a machining process, or the like.

Figure 17A:
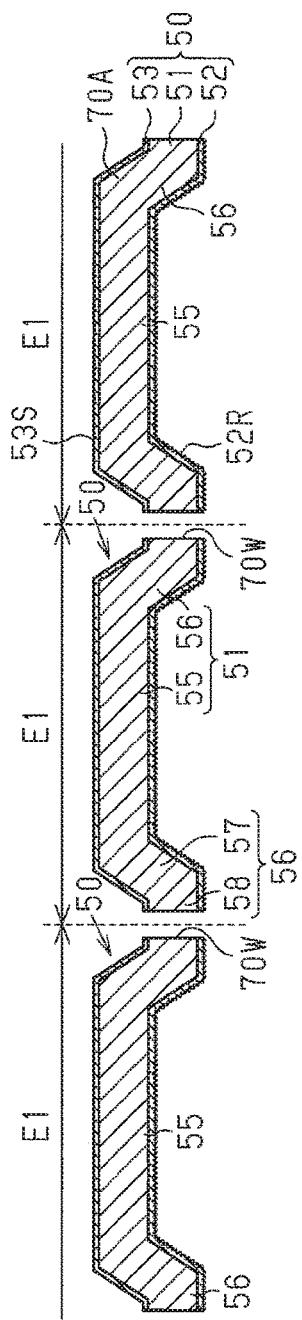
FIG. 17A is a schematic cross-sectional view illustrating the method for manufacturing the semiconductor device of FIG. 15.

In the step illustrated in FIG. 17A, in the same manner as the steps of FIGS. 6A to 6C, the metal layer 52 is formed on the lower surface of the heat dissipation plate 70A, and the metal layer 53 is formed on the upper surface of the heat dissipation plate 70A. This forms the heat dissipation plate 50, which includes the base plate 51 and the metal layers 52 and 53, in each separate region E1.

Figure 17B:
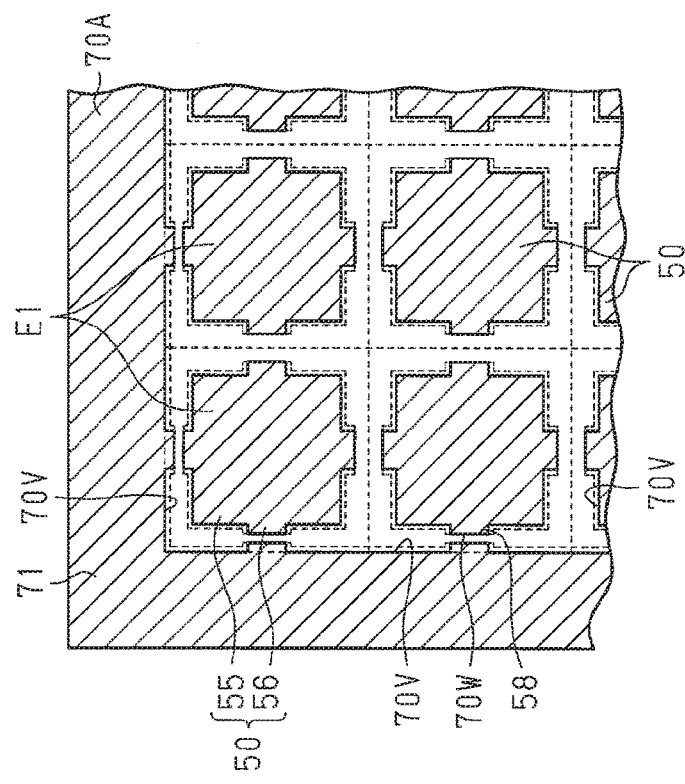
FIG. 17B is an enlarged plan view illustrating the method for manufacturing the semiconductor device of FIG. 15.

Then, in the same manner as the step of FIGS. 7A and 7B, the heat dissipation plate 70A is divided into the heat dissipation plates 50 by cutting the intermediate portion of each projection 56 in each separate region E1. In the present example, as illustrated in FIG. 17B, the extension 58 of each projection 56 and the metal layers 52 and 53 covering the extension 58 are cut at an intermediate portion of the extension 58 in the extending direction of the extension 58 to form an opening 70W, through which the adjacent openings 70V are in communication. This separates each heat dissipation plate 50 from the adjacent heat dissipation plate 50 and the frame 71 and singulates the large heat dissipation plate 70A into the heat dissipation plates 50. Further, the distal end surface (i.e., cut surface) of each projection 56 (extension 58) of the base plate 51 is exposed to the outside. Thus, the metal layers 52 and 53 are not formed on the distal end surface of each projection 56.

FIGS. 8A to 9B, the separated heat dissipation plates 50 are bonded to the rear surfaces of the semiconductor elements 30 by the adhesive 40 (refer to FIG. 14A). Further, the encapsulation resin 60 is formed and the cutting step is performed to manufacture the semiconductor device 10C of the present embodiment.

The third embodiment has the same advantages as the first embodiment.

It should be apparent to those skilled in the art that the foregoing embodiments may be employed in many other specific forms without departing from the scope of this disclosure. Particularly, it should be understood that the foregoing embodiments may be employed in the following forms.

In each of the above embodiments, the metal layer 53, which includes the smooth surface 53S, is formed on the upper surface of each projection 56. However, a different metal layer may be formed on the upper surface of each projection 56.

Figure 18:
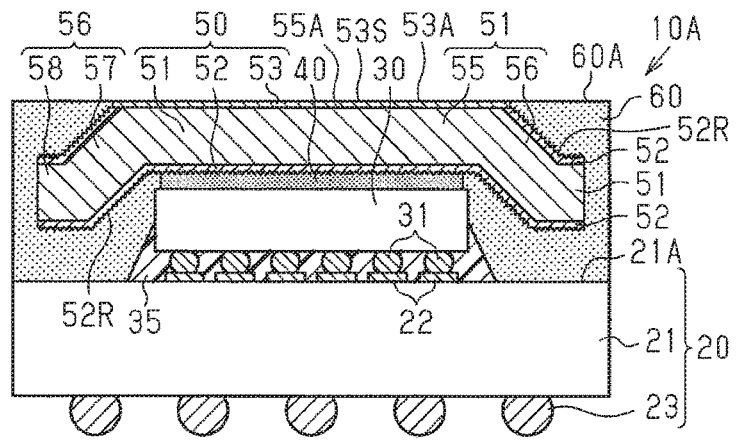
FIGS. 18 to 23 are schematic cross-sectional views illustrating various modified examples of a semiconductor device.

For example, referring to FIG. 18, the metal layer 52, which includes the roughened surface 52R, may be also formed on the upper surface of each projection 56. The metal layer 52 entirely covers the surfaces of each projection 56 excluding the distal end surface of each projection 56. Further, in the same manner as FIGS. 1 and 2, the metal layer 52 covers the entire lower surface of the base plate 51 and the side surfaces of the body 55. Thus, in FIG. 18, except for the upper surface of the body 55 and the distal end surface of each projection 56, the surface of the heat dissipation plate 50 is the roughened surface 52R. In this structure, the upper surface of the projection 56, which contacts the encapsulation resin 60, defines the roughened surface 52R. This produces an anchor effect and improves the adhesion between the heat dissipation plate 50 and the encapsulation resin 60. Thus, separation of the heat dissipation plate 50 from the semiconductor element 30 and the encapsulation resin 60 is limited in a preferred manner.

In this case, for example, electrolytic plating is performed using only the upper surface 55A of the body 55 as a mask to form the metal layer 52. Thus, the metal layer 52 is formed by performing electrolytic plating with the upper surface of each projection 56 in an exposed state.

In each of the above embodiments, the metal layer 53, which includes the smooth surface 53S, is formed on the upper surface of the base plate 51. However, a different metal layer may be formed on the upper surface of the base plate 51.

Figure 19:
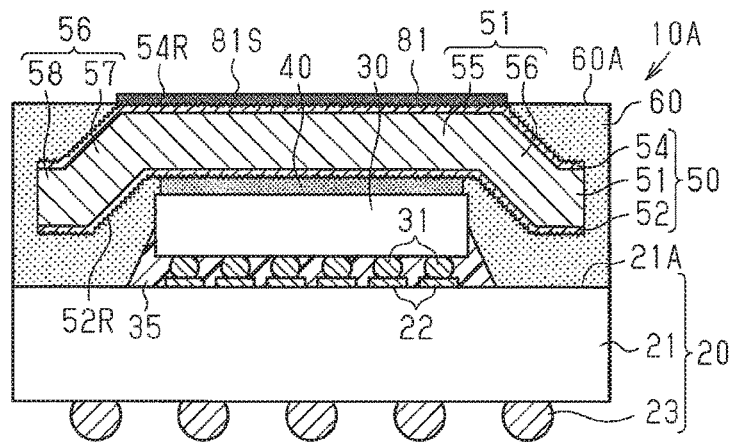

For example, as illustrated in FIG. 19, a metal layer 54, which includes a roughened surface 54R, is formed on the upper surface of the base plate 51. The metal layer 54 covers the entire upper surface of the base plate 51, that is, the entire upper surface of the body 55 and the entire upper surface of each projection 56. From the viewpoint of adhesion with the encapsulation resin 60, the roughened surface 54R is set to have a higher surface roughness than the upper surface of the base plate 51. The roughened surface 54R has, for example, a surface roughness Ra of, for example, 0.1 μm or higher. This improves the adhesion between the heat dissipation plate 50 and the encapsulation resin 60. In the same manner as FIGS. 1 and 2, in FIG. 19, the metal layer 52 covers the entire lower surface of the base plate 51 and the side surfaces of the body 55. Thus, in FIG. 19, except for the distal end surface of each projection 56, the surface of the heat dissipation plate 50 is the roughened surface 52R or 54R.

In the semiconductor device 10A of FIG. 19, the upper surface (roughened surface 54R) of the metal layer 54, which covers the upper surface of the body 55, is exposed from the encapsulation resin 60. However, in the semiconductor device 10A, it is preferred that the upper surface of the metal layer 54, which is exposed from the encapsulation resin 60, be covered by a resin layer 81 that has a smooth surface 81S. The smooth surface 81S is set to have a lower surface roughness than the roughened surface 54R. When forming an identification mark in the upper surface of the semiconductor device 10A, the identification mark may be formed in the upper surface (smooth surface 81S) of the semiconductor device 10A. This improves the visibility of the identification mark.

In each of the above embodiments, the metal layers 52 and 53 are formed through electrolytic Ni plating. Instead, the metal layers 52 and 53 may be formed through, for example, electrolytic Cu plating.

In each of the above embodiments, the metal layer 52, which includes the roughened surface 52R, is formed on the lower surface of the base plate 51 so that the lower surface of the heat dissipation plate 50 is roughened. However, the heat dissipation plate 50 is not limited to such a structure.

Figure 20:
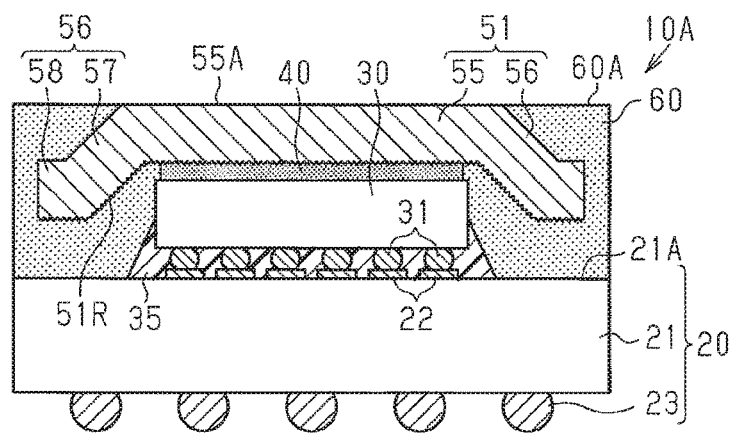

For example, as illustrated in FIG. 20, the metal layers 52 and 53 may be omitted, and the entire lower surface of the base plate 51 may be defined by a roughened surface 51R. In this case, for example, after the step of FIG. 5B, a roughening process is performed on the lower surface of the base plate 51 to form the roughened surface 51R. The roughening process may be, for example, a laser process, a blasting process, an etching process, or a blackening process.

In the same manner, with the modified example of FIG. 18, a roughening process may be performed on the upper surface of each projection 56 to roughen the upper surface of the projection 56. With the modified example of FIG. 19, a roughening process may be performed on the upper surface of the base plate 51 to roughen the upper surface of the base plate 51.

Figure 21:
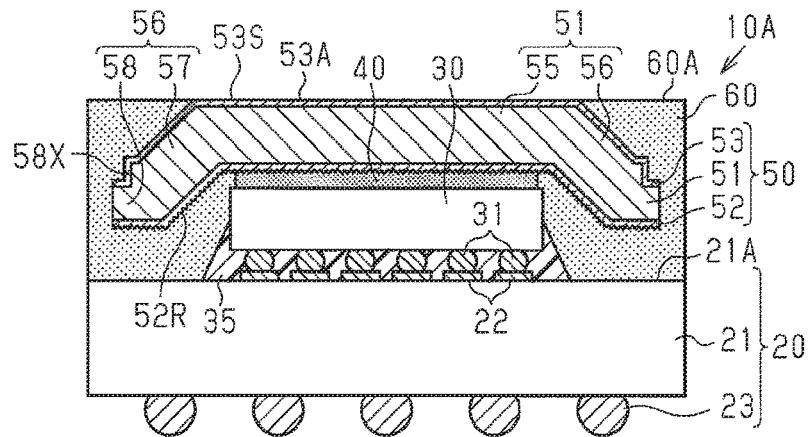

Referring to FIG. 21, the upper surface of each extension 58 may include a cutaway portion 58X. The cutaway portion 58X is formed in the upper surface of the extension 58 at the distal end of the extension 58 (end closer to peripheral edge of wiring substrate 20). In the semiconductor device 10A, the portion where the extension 58 is cut is thinner than that when the extension does not include the cutaway portion 58X. This decreases the cut amount of the extensions 58 (heat dissipation plates 50) when cutting a large dissipation plate. The cutaway portions 58X are formed, for example, by performing a pressing process to partially thin the extensions 58. The cutaway portions 58X may also be formed in the lower surfaces of the distal ends of the extensions 58.

Figure 22:
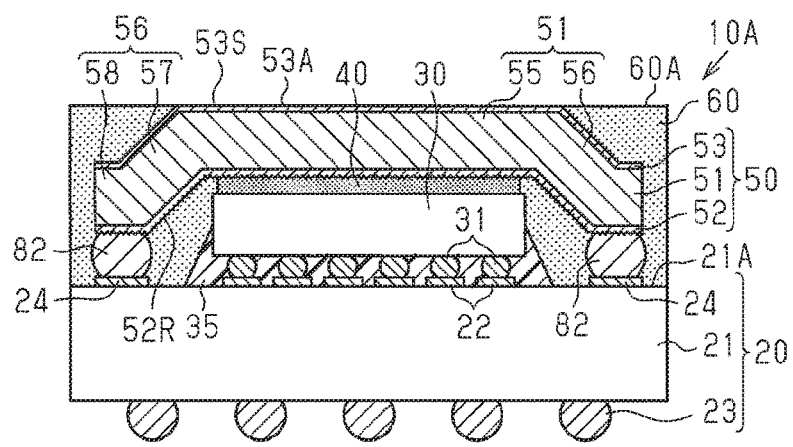

Referring to FIG. 22, the projections 56 (here, extensions 58) of the heat dissipation plate 50 may be bonded to ground wirings 24, which are formed on the upper surface 21A of the substrate body 21, with an adhesive 82. The adhesive 82 is electrically conductive. For example, an Ag paste may be used as the adhesive 82. The adhesive 82 electrically connects the heat dissipation plate 50 to the ground wirings 24. An electrically conductive material such as Cu, Ag, Al, an alloy of these elements, or the like is used as the material of the heat dissipation plate 50.

The ground wirings 24 are set to the ground potential. Thus, the heat dissipation plate 50, which is electrically connected to the ground wirings 24, is set to the ground potential. The ground wirings 24 are formed in the peripheral region of the substrate body 21 and exposed from the underfill resin 35.

In the semiconductor device 10A, the heat dissipation plate 50 may function as a shield layer that protects the semiconductor element 30 from electromagnetic waves and the like.

The modified examples of FIGS. 18 to 22 are examples modifying the semiconductor device 10A of the first embodiment. The semiconductor devices 10B and 10C of the second and third embodiments may be modified in the same manner.

In the semiconductor devices 10A to 10C of the above embodiments, the second embodiment, and the first modified example, the ground wirings 24 may be formed on the upper surface 21A of the substrate body 21 in the same manner as the semiconductor device 10A of FIG. 22. In this case, the heat dissipation plate 50 is electrically connected to the ground wirings 24 by an electrically conductive encapsulation resin.

In each of the above embodiments, the side surfaces of the base plate 51 except for the distal end surface of the projections 56 and 56A (extensions 58 and 58A) are covered by the metal layer 52. Instead, the side surfaces of the base plate 51 except for the distal end surface of each of the projections 56 and 56A (extensions 58 and 58A) may be covered by the metal layer 53. Further, the side surfaces of the base plate 51 may be entirely exposed from the metal layers 52 and 53.

The metal layer 53 may be omitted in each of the above embodiments.

Figure 23:
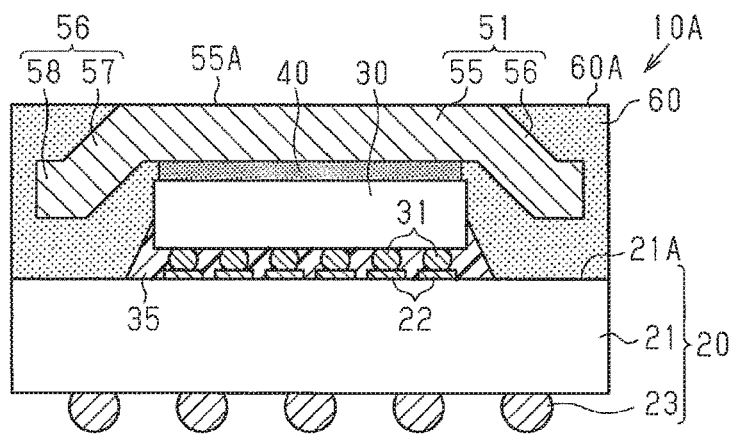

Referring to FIG. 23, the metal layers 52 and 53 may be omitted from the semiconductor device 10A. In this case, the encapsulation resin 60 directly contacts and covers the upper surface and the lower surface of each projection 56. In the same manner, the metal layers 52 and 53 may be omitted from the semiconductor devices 10B and 10C.

In each of the above embodiments and modified examples, the connection portions 57 of the heat dissipation plate 50 may be bent to extend vertically downward from the end of the body 55.

In each of the above embodiments, the wiring substrate 20 that includes the separate regions C1 arranged in a matrix is used as a wiring substrate in the manufacturing process. Instead, for example, the wiring substrate 20 may include lines of the separate regions C1. That is, there is no particular limit to the layout of the separate regions C1 as long as the wiring substrate includes an arrangement of an N×M number (where N is an integer greater than or equal to two, and M is an integer greater than or equal to one) of the separate regions C1.

In each of the above embodiments, the large heat dissipation plates 70, 70A each include a plurality of heat dissipation plates 50 (separate regions E1) that is arranged in a matrix. Instead, for example, a large heat dissipation plate may include a plurality of heat dissipation plates 50 (separate regions E1) that are laid out in a strip-shaped arrangement. That is, the layout of the heat dissipation plates 50 (separate regions E1) is not particularly limited as long as an N×M number of heat dissipation plates 50 is arranged in a large heat dissipation plate.

In each of the above embodiments and modified examples, there is no particular limit to the number of semiconductor elements 30 that are mounted on the wiring substrate 20. For example, two or more semiconductor elements 30 may be mounted on the wiring substrate 20.

Electronic components other than the semiconductor element 30 may be mounted on the wiring substrate 20.

Each of the above embodiments and modified examples is applied to the wiring substrate 20 of a BGA type. However, each of the above embodiments and modified examples may be applied to a wiring substrate of a pin grid array (PGA) type or a land grid array (LGA) type.

In each of the above embodiments and modified examples, various cooling means and heat dissipation means such as a heat dissipation fin, a heat pipe, a vapor chamber, and the like may be arranged above the heat dissipation plate 50.

The above embodiments and modified examples may be combined. For example, in the semiconductor device 10C of the third embodiment, the distal end surface of each projection 56 in the heat dissipation plate 50 may be exposed from the encapsulation resin 60 in the same manner as the projections 56A of the semiconductor device 10B.

Clauses

This disclosure further encompasses the following embodiments.

1. A method for manufacturing a semiconductor device, the method including:

preparing a wiring substrate that includes an N×M number of separate regions, where N is an integer greater than or equal to two, and M is an integer greater than or equal to one;

mounting a semiconductor element on an upper surface of the wiring substrate in each of the separate regions;

preparing a large heat dissipation plate including an N×M number of heat dissipation plates that are connected to each other, wherein each of the heat dissipation plates includes a body and a projection formed integrally with the body, and the projection projects outward from an end of the body so that the projection and the body form a step;

cutting the large heat dissipation plate at a given location on the projection to separate the large heat dissipation plate into the N×M number of heat dissipation plates;

simultaneously attracting the N×M number of heat dissipation plates after the cutting, and transporting the heat dissipation plates onto the semiconductor elements;

bonding each of the heat dissipation plate to an upper surface of the corresponding one of the semiconductor elements with an adhesive so that the body of the heat dissipation plate is overlapped with the semiconductor element in a plan view;

filling a gap between each heat dissipation plate and the wiring substrate with an encapsulation resin, wherein the encapsulation resin covers upper, lower, and side surfaces of the projection and exposes an upper surface of the body; and cutting the encapsulation resin and the wiring substrate in a cutting region to singulate semiconductor devices, wherein the cutting region is set at an outer side of the projection in each separate region.

2. The method according to clause 1, further including roughening a lower surface of the large heat dissipation plate before separating the large heat dissipation plate into the N×M number of heat dissipation plates so that the roughened lower surface of the large heat dissipation plate has a higher surface roughness than the upper surface of the body.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A semiconductor device comprising:
a wiring substrate;
a semiconductor element mounted on the wiring substrate;
a heat dissipation plate bonded to an upper surface of the semiconductor element with an adhesive; and
an encapsulation resin that fills a gap between the heat dissipation plate and the wiring substrate, wherein;
the heat dissipation plate includes
a body overlapped with the semiconductor element in a plan view, wherein the body is larger than the semiconductor element in a plan view, and
a projection formed integrally with the body, wherein the projection projects outward from an end of the body and is located at a lower position than the body;
the encapsulation resin covers upper, lower, and side surfaces of the projection;
the body includes an upper surface exposed from the encapsulation resin; and
the heat dissipation plate includes side surfaces, and the side surfaces of the heat dissipation plate except for a distal end surface of the projection are formed as roughened surfaces that have a higher surface roughness than the upper surface of the body.

2. The semiconductor device according to claim 1, wherein the heat dissipation plate includes a lower surface, and the lower surface of the heat dissipation plate is formed as a roughened surface that has a higher surface roughness than the upper surface of the body.

3. The semiconductor device according to claim 2, wherein:
the heat dissipation plate includes
a base plate including the body and the projection,
a first metal layer formed on a lower surface of the base plate, and
a second metal layer formed on the upper surface of the body;
the first metal layer includes the roughened surface having a higher surface roughness than a lower surface of the body; and
the second metal layer includes a smooth surface having a lower surface roughness than the roughened surface.

4. The semiconductor device according to claim 3, wherein the first metal layer covers the upper surface of the projection.

5. The semiconductor device according to claim 3, wherein the first metal layer covers the side surfaces of the base plate except for the distal end surface of the projection.

6. The semiconductor device according to claim 2, wherein
the heat dissipation plate includes
a base plate including the body and the projection,
a first metal layer formed on a lower surface of the base plate,
a third metal layer formed on an upper surface of the base plate, and
a resin layer that covers an upper surface of the third metal layer that is exposed from the encapsulation resin;
the first metal layer includes the roughened surface having a higher surface roughness than a lower surface of the body;
the third metal layer includes a roughened surface having a higher surface roughness than the upper surface of the body; and
the resin layer includes a smooth surface having a lower surface roughness than the roughened surface of the third metal layer.

7. The semiconductor device according to claim 6, wherein the first metal layer covers the side surfaces of the base plate except for the distal end surface of the projection.

8. The semiconductor device according to claim 1, wherein the projection projects outward from corners of the main body or from a portion in each side of the body.

9. The semiconductor device according to claim 1, wherein the projection includes
a connection portion that extends downward from the end of the body, and
an extension that extends from an end of the connection portion toward a peripheral edge of the wiring substrate in parallel to the body.

10. The semiconductor device according to claim 1, wherein the projection is electrically connected to a ground wiring, which is formed on an upper surface of the wiring substrate, by an electrically conductive adhesive.

11. A semiconductor device comprising:
a wiring substrate;
a semiconductor element mounted on the wiring substrate;
a heat dissipation plate bonded to an upper surface of the semiconductor element with an adhesive; and
an encapsulation resin that fills a gap between the heat dissipation plate and the wiring substrate, wherein
the heat dissipation plate includes
a body overlapped with the semiconductor element in a plan view, wherein the body is larger than the semiconductor element in a plan view, and
a projection formed integrally with the body, wherein the projection projects outward from an end of the body and is located at a lower position than the body;
the encapsulation resin covers upper, lower, and side surfaces of the projection;
the body includes an upper surface exposed from the encapsulation resin;
the heat dissipation plate includes a lower surface, and the lower surface of the heat dissipation plate is formed as a roughened surface that has a higher surface roughness than the upper surface of the body;
the heat dissipation plate includes a base plate including the body and the projection, a first metal layer formed on a lower surface of the base plate, a third metal layer formed on an upper surface of the base plate, and a resin layer that covers an upper surface of the third metal layer that is exposed from the encapsulation resin;

the first metal layer includes the roughened surface having a higher surface roughness than a lower surface of the body;

the third metal layer includes a roughened surface having a higher surface roughness than the upper surface of the body; and the resin layer includes a smooth surface having a lower surface roughness than the roughened surface of the third metal layer.

12. The semiconductor device according to claim 11, wherein the first metal layer covers side surfaces of the base plate except for a distal end surface of the projection.

13. The semiconductor device according to claim 11, wherein the projection projects outward from corners of the main body or from a portion in each side of the body.

14. The semiconductor device according to claim 11, wherein the projection includes a connection portion that extends downward from the end of the body, and an extension that extends from an end of the connection portion toward a peripheral edge of the wiring substrate in parallel to the body.

15. The semiconductor device according to claim 11, wherein the projection is electrically connected to a ground wiring, which is formed on an upper surface of the wiring substrate, by an electrically conductive adhesive.

* * * * *